US012812944B2

(12) United States Patent
Liu et al.

(10) Patent No.: US 12,812,944 B2
(45) Date of Patent: Nov. 24, 2026

(54) METHODS FOR FORMING STACKED MULTI-GATE DEVICE USING VERTICAL DIPOLE PATTERNING

(71) Applicant: TAIWAN SEMICONDUCTOR MANUFACTURING COMPANY, LTD., Hsinchu (TW)

(72) Inventors: Chun-Yu Liu, New Taipei City (TW); Tsung-Kai Chiu, Hsinchu County (TW); Che Chi Shih, Taoyuan City (TW); Ku-Feng Yang, Hsinchu County (TW); Szuya Liao, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 351 days.

(21) Appl. No.: 18/443,072

(22) Filed: Feb. 15, 2024

(65) Prior Publication Data

US 2025/0267915 A1 Aug. 21, 2025

(51) Int. Cl.

| | |
|---|---|
| ***H10D 64/01*** | (2025.01) |
| ***H10D 30/01*** | (2025.01) |
| ***H10D 30/62*** | (2025.01) |
| ***H10D 30/67*** | (2025.01) |
| ***H10D 62/10*** | (2025.01) |
| ***H10P 50/28*** | (2026.01) |
| ***H10W 20/00*** | (2026.01) |

(52) U.S. Cl.

CPC ......... *H10D 64/017* (2025.01); *H10D 30/024* (2025.01); *H10D 30/6215* (2025.01); *H10D 30/6735* (2025.01); *H10D 30/6757* (2025.01); *H10D 62/121* (2025.01); *H10P 50/287* (2026.01); *H10W 20/056* (2026.01); *H10W 20/081* (2026.01)

(58) Field of Classification Search

CPC ............. H10D 64/017; H10D 30/6757; H10D 30/024; H10D 30/6215; H10D 30/6735; H10D 62/121

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |

(Continued)

FOREIGN PATENT DOCUMENTS

| | | |
|---|---|---|
| CN | 116544234 A | 8/2023 |
| CN | 116825721 A | 9/2023 |

*Primary Examiner* — Steven M Page

(74) *Attorney, Agent, or Firm* — Maschoff Brennan

(57) ABSTRACT

Method to selectively diffuse dipole dopants into the high-k gate dielectric layer is provided. A method of the present disclosure includes an etching back process controlling DC and bias power, a periodical switching of the bias power is synchronized with a periodical switching of the DC power, leading to a balanced etching rate and uniform depth of recesses in dummy materials within the gate trenches for the subsequent selective diffusion process across different devices. Additionally, during the etching back process, a protective passivation layer can be formed as a barrier on the sidewall of the recess and/or at the bottom of the recess.

20 Claims, 41 Drawing Sheets

(56) References Cited

U.S. PATENT DOCUMENTS

| | | | | |
|---|---|---|---|---|
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2018/0226490 | A1* | 8/2018 | Le | B82Y 10/00 |
| 2022/0320293 | A1* | 10/2022 | Liao | H10D 30/014 |
| 2023/0343847 | A1 | 10/2023 | Cheng | |
| 2023/0411219 | A1 | 12/2023 | Huang | |
| 2023/0420562 | A1* | 12/2023 | Huang | H10D 30/024 |
| 2024/0321640 | A1* | 9/2024 | Chen | H10D 30/014 |

* cited by examiner

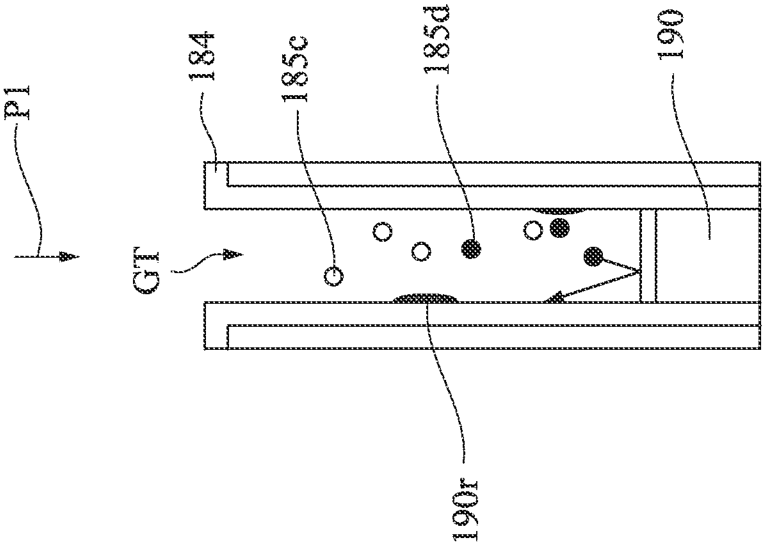
Fig. 5B
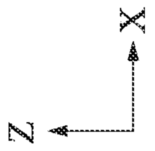

METHODS FOR FORMING STACKED MULTI-GATE DEVICE USING VERTICAL DIPOLE PATTERNING

BACKGROUND

As the semiconductor industry further progresses into sub-10 nanometer (nm) technology process nodes in pursuit of higher device density, higher performance, and lower costs, challenges from both fabrication and design issues have led to stacked device structure configurations, such as complementary field effect transistors (C-FET) where an n-type multi-gate transistor and a p-type multi-gate transistor are stacked vertically, one over the other. While existing C-FET structures are generally adequate for their intended purposes, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
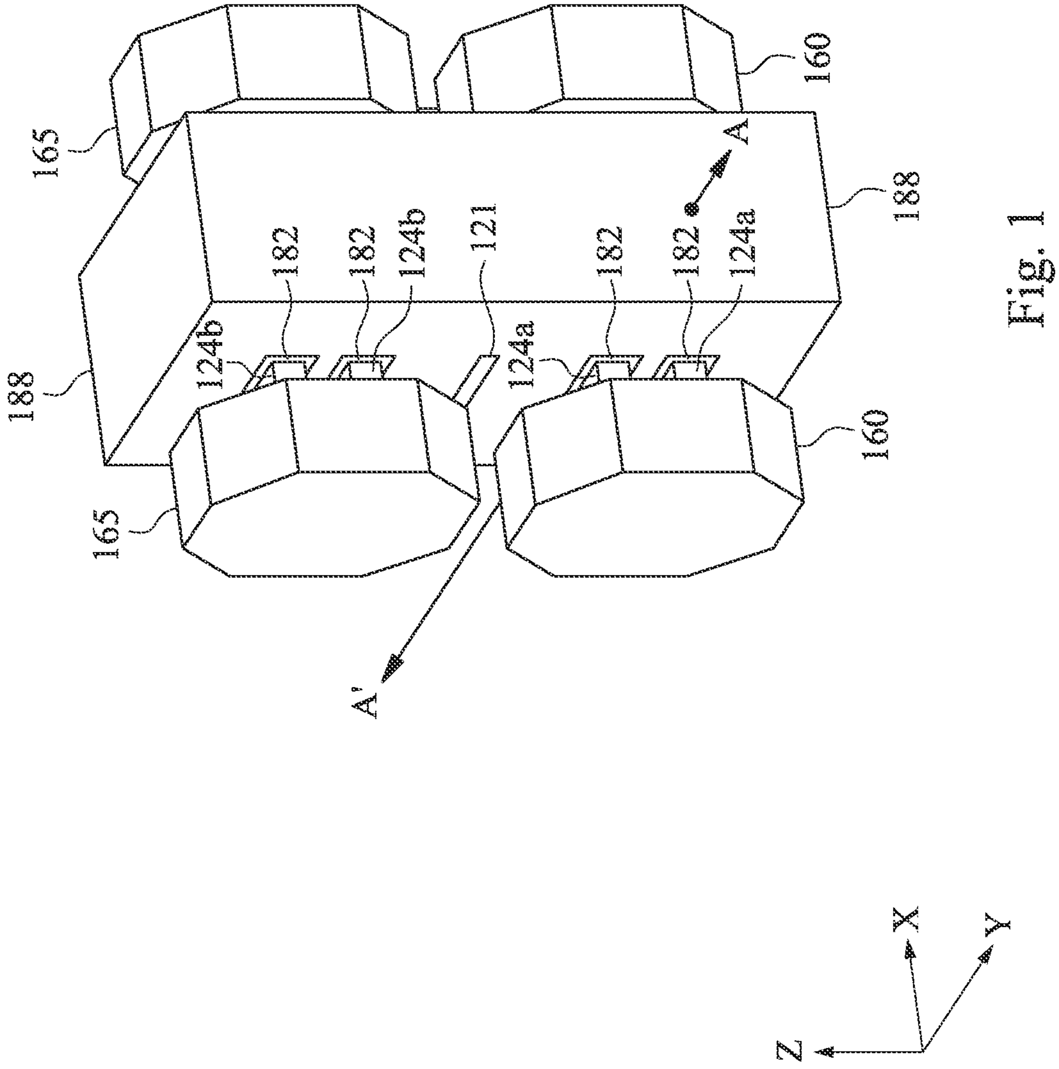
FIG. 1 illustrates an example of a complementary field-effect transistor (CFET) schematic in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated. One skilled in the art will realize, however, that the values or ranges recited throughout the description are merely examples, and may be reduced or varied with the down-scaling of the integrated circuits.

The present disclosure in various embodiments provides a method for selectively diffusing dipole dopants into the high-k dielectric layers of Complementary FETs (CFETs), targeting either the top-tier or bottom-tier transistors to tune their electrical characteristics. This method is applied with an etching back process, effectively enhancing CFET performance regardless of gate widths or placement on the wafer, ensuring uniform and high-quality performance across various CFET configurations. Specifically, the etching back process can control DC and RF power during the etching back process, particularly the periodic on-off cycling of both bias and DC power, which in turn ensures an even distribution of etching gas across gate trenches of varying widths, leading to a balanced etching rate and uniform depth of recesses in dummy materials within the gate trenches for the subsequent selective diffusion process across different devices. Additionally, the etching back process can be performed at least in two phases. The first phase can target on etching downwards through the dummy material. Simultaneously, a protective passivation layer can be formed on the sidewalls of the recess, which in turn prevents unintentional lateral etching. The second phase can be performed with forming another protective passivation layer at the bottom of the recess. This layer acts as a barrier, stopping further downward etching of the dummy material, and this second phase can include the removal of residual dummy material over the gate spacer.

Specifically, FIGS. 2A-8B illustrate the selective diffusion process targeting the top-tier transistor of a CFET. Alternatively, FIGS. 9-16B illustrate the selective diffusion process targeting the bottom-tier transistor of a CFET. This method can offers flexibility in adjusting transistor properties based on their position within the CFET structure. In some embodiments, multiple CFETs within a semiconductor structure can undergo distinct diffusion processes (see FIGS. 22-33C). For example, one CFET might have dopants diffused in the high-k dielectric layer of its top-tier transistor, while another CFET in the same structure might undergo diffusion in its bottom-tier transistor. Furthermore, FIGS. 17-21C illustrates an embodiment where dopants are diffused simultaneously into both the top-tier and bottom-tier transistors of a CFET.

Reference is made to FIG. 1. FIG. 1 illustrates an example of a complementary field-effect transistor (CFET) schematic in a three-dimensional view, in accordance with some embodiments. The CFETs include multiple vertically stacked nanostructure-FETs. For example, a CFET may include a lower nanostructure-FET of a first device type (e.g., n-type/p-type) and an upper nanostructure-FET of a second device type (e.g., p-type/n-type) that is opposite (or the same as) the first device type. Specifically, the CFET may include a lower PMOS transistor and an upper NMOS transistor, or the CFET may include a lower NMOS transistor and an upper PMOS transistor. Each of the nanostructure-FETs include epitaxial layers 124_a_ and 124_b_ as channel regions. The epitaxial layers 124_a_ and 124_b_ may be nanosheets, nanowires, or the like. An isolation layer 121 may be formed to separate and electrically isolate the upper epitaxial layers 124_b_ from the lower epitaxial layers 124_a_. A high-k dielectric layer 182 is formed along top surfaces, sidewalls, and bottom surfaces of the epitaxial layer 124_a_/124_b_. A metal gate electrode 188 is formed over the high-k dielectric layer 182 and around the epitaxial layer 124_a_/124_b_. Source/drain epitaxial structures 160 and 165 are disposed at opposing sides of the metal gate electrode 188. Source/drain epitaxial structure 160/165 may refer to a source or a drain, individually or collectively dependent upon the context.

Figure 2A:
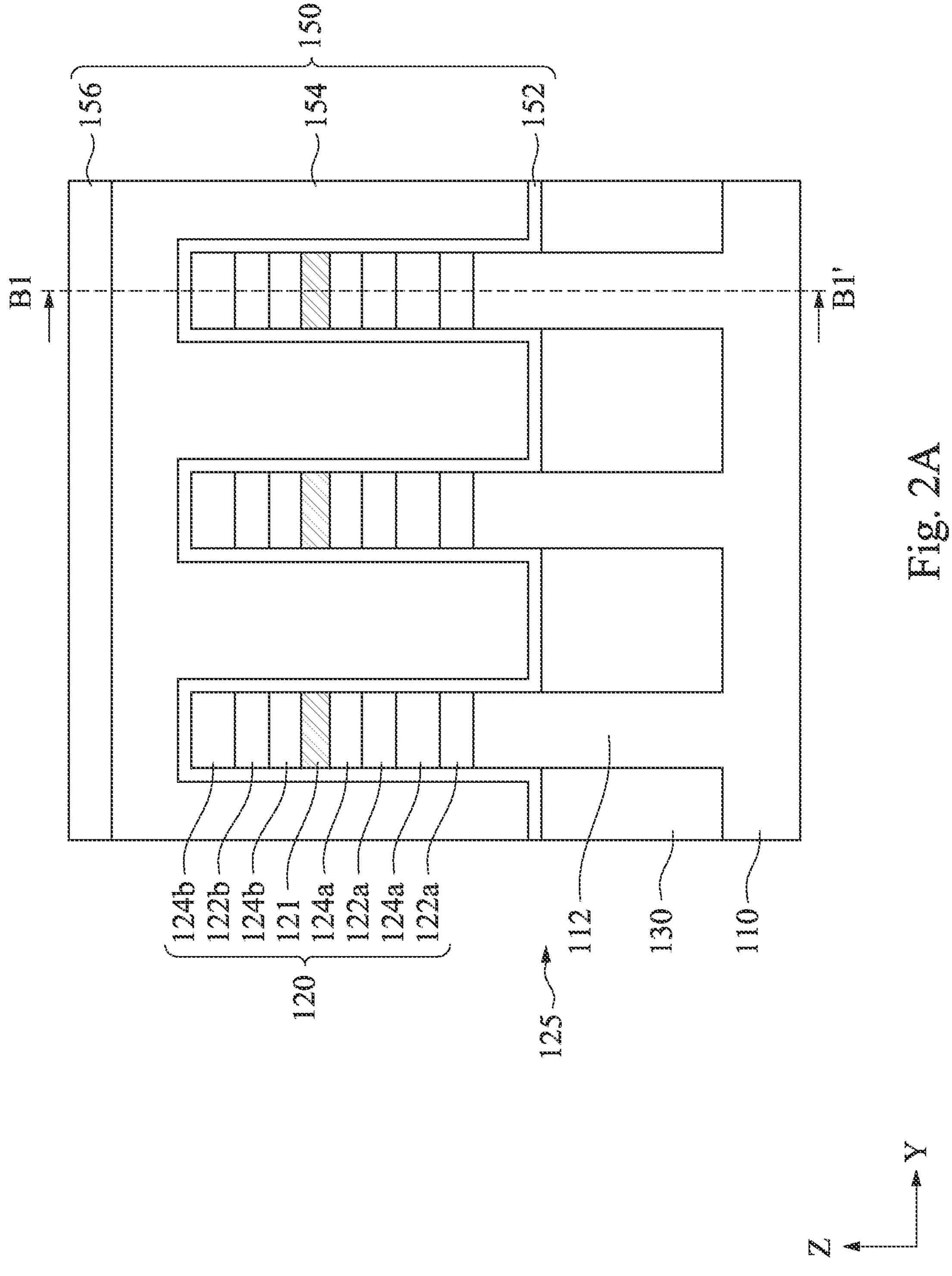
FIGS. 2A-8B illustrate schematic views of intermediate stages in the manufacturing of CFETs in accordance with some embodiments.
Figure 6:
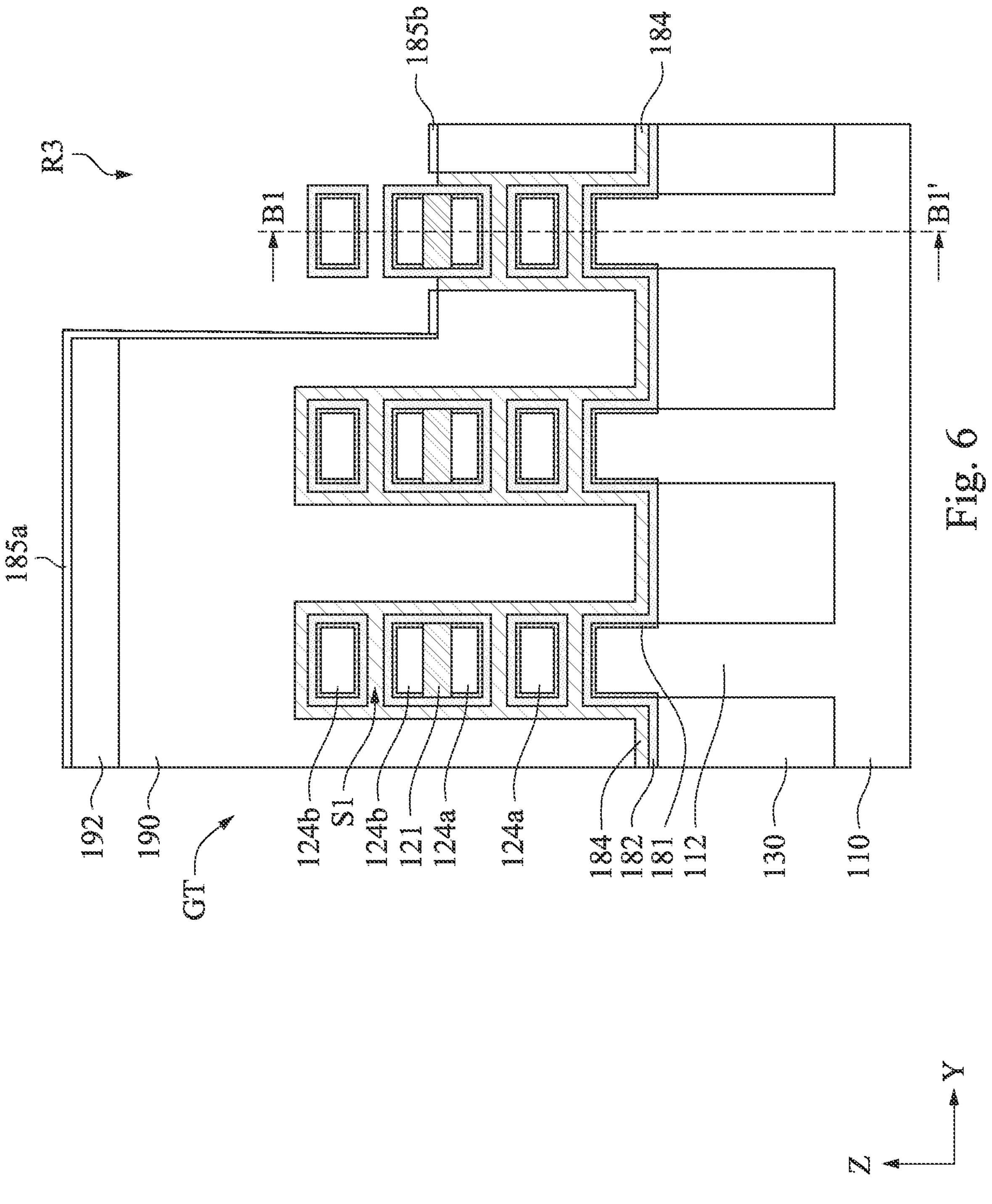
Figure 7:
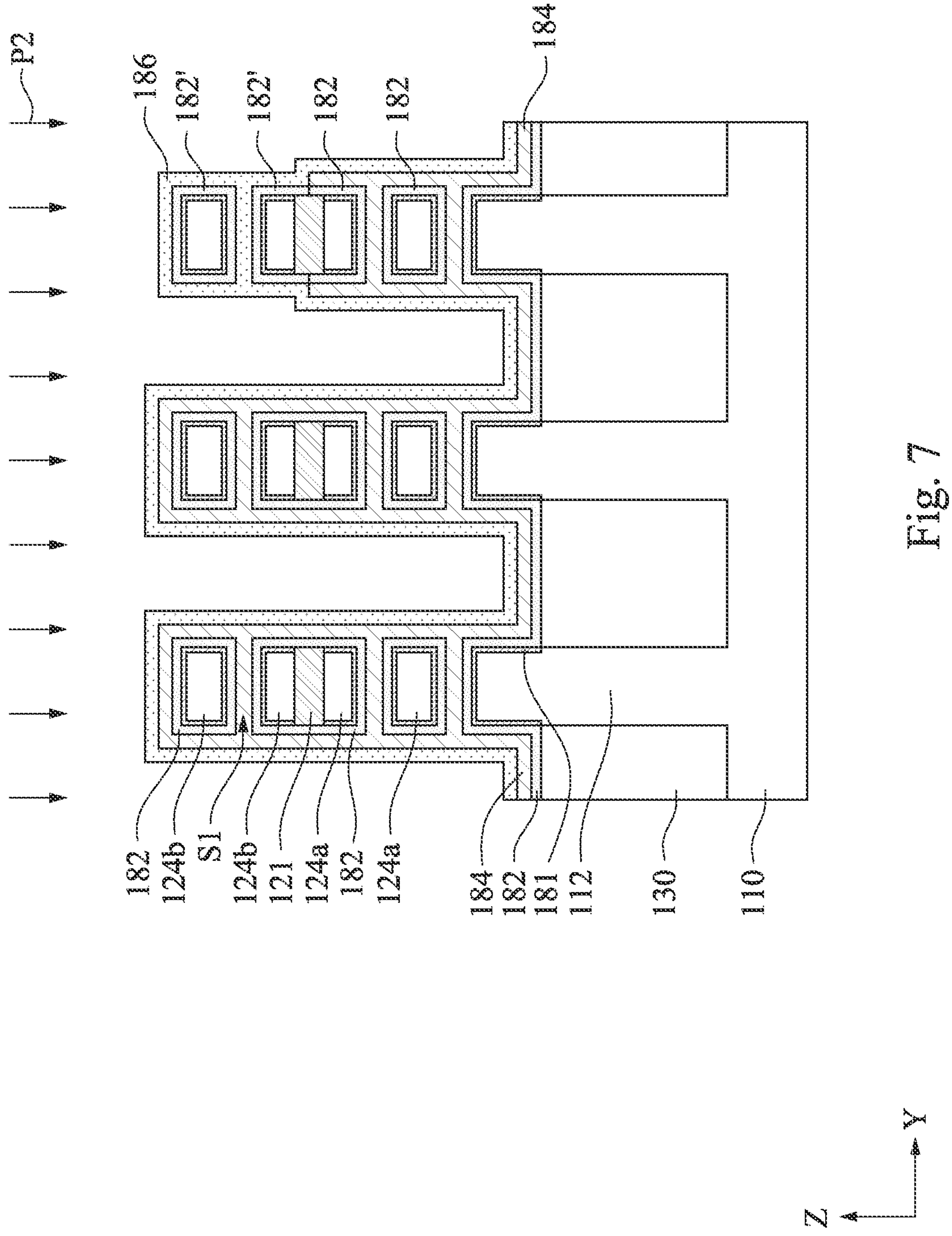
Figure 8A:
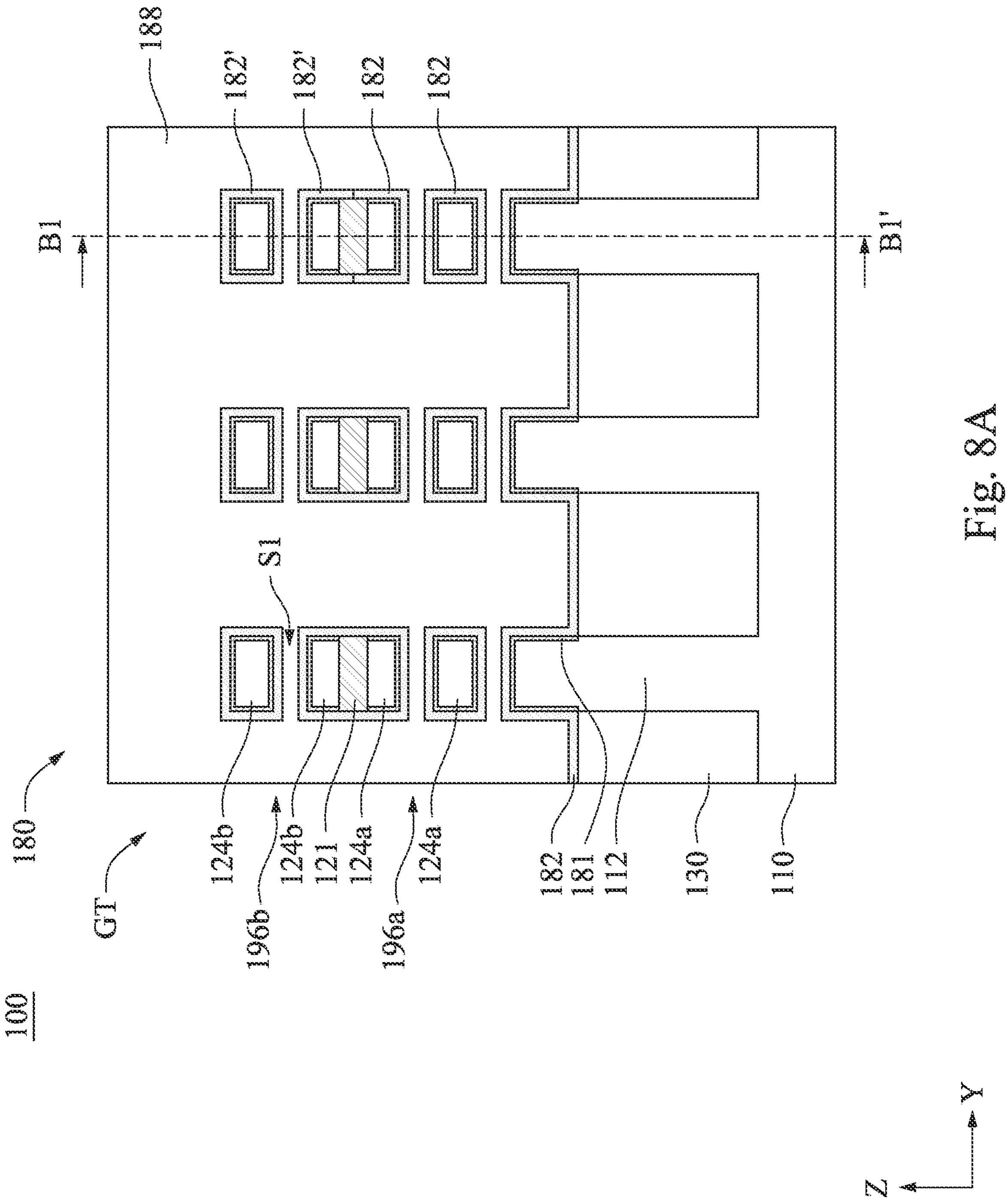
Figure 8B:
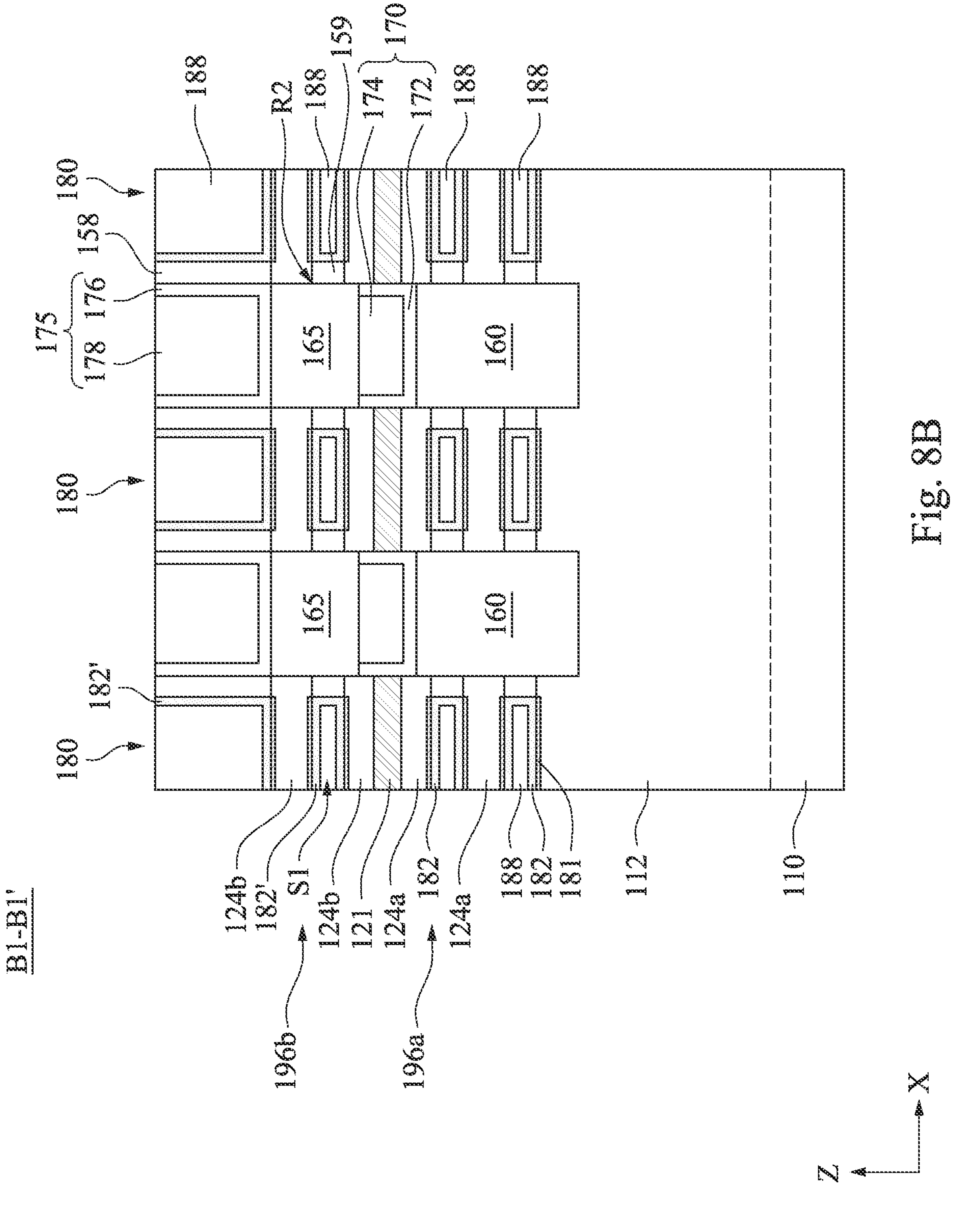

Reference is made to FIGS. 2A-8B. FIGS. 2A-8B illustrate schematic views of intermediate stages in the manufacturing of CFETs in accordance with some embodiments. FIGS. 2A, 3, 4, 5A, 6, 7, and 8A illustrate cross-sectional views along a similar cross-section as reference cross-section A-A' in FIG. 1. FIGS. 2B and 8B illustrate cross-sectional views taken along line B1-B1' as shown in FIGS. 2A and 8A. FIG. 5B illustrates a cross-sectional views taken along line B2-B2' as shown in FIG. 5A.

Figure 2B:
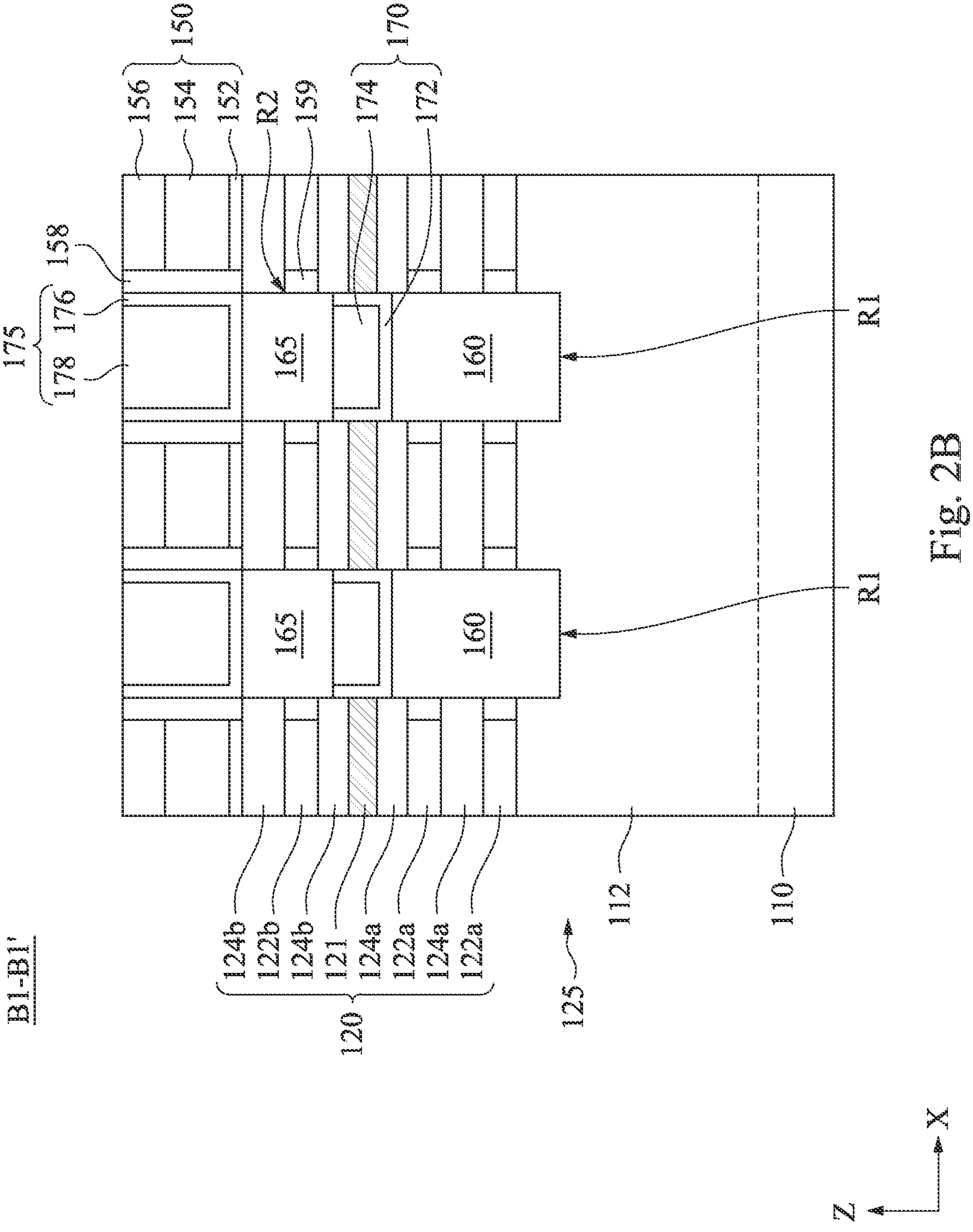

Reference is made to FIGS. 2A and 2B. A multi-layer stack 120 is formed over a substrate 110. In some embodiments, the substrate 110 may include germanium (Ge), silicon germanium (SiGe), a III-V material, the like or a combination thereof. The multi-layer stack 120 includes epitaxial layers (or sacrificial layers) 122_a_ and 122_b_ of a first composition interposed by epitaxial layers (or sacrificial layers) 124_a_ and 124_b_ of a second composition different than the first composition. The multi-layer stack 120 further includes an isolation layer 121. The isolation layer 121 can be formed of an insulating material, such as $SiO_2$, SiN, SiOCN, or the like. In some embodiments, the isolation layer 121 may have a carbon atomic concentration less than about 6%. The isolation layer 121 may be deposited by a process such as chemical vapor deposition (CVD) or atomic layer deposition (ALD), or the like. The epitaxial layers 124_a_ and 124_b_ may also be referred to as channel regions. channel layers, channel patterns, or semiconductive nanostructures. In some embodiments, the epitaxial layers 122_a_ and 122_b_ can be epitaxially grown silicon germanium (SiGe) layers and the epitaxial layers 124_a_ and 124_b_ can be epitaxially grown silicon (Si) layers.

Fin structures 125 extending from the substrate 110 is formed. In various embodiments, the fin structure 125 includes a protruding portion 112 formed from the substrate 110 and the multi-layer stack 120 including epitaxial layers 122_a_, 122_b_, 124_a_, 124_b_, and the isolation layer 121. An isolation structure 130 can be formed to surround the protruding portion 112. The isolation structure 130 may include a dielectric material, such as silicon oxide ($SiO_2$), and may be formed using flowable chemical vapor deposition (FCVD), spin-on coating, or the like.

Dummy gate structures 150 can be formed over the substrate 110 and partially over the fin structure 125. The dummy gate structures 150 may include a dummy gate dielectric layer 152, a dummy gate electrode layer 154, and a hard mask layer 156. In some embodiments, the dummy gate dielectric layer 152 may be made of a dielectric material such as silicon nitride (SiN), silicon oxide ($SiO_2$), or the like. In some embodiments, the dummy gate electrode layer 154 may include polycrystalline-silicon (poly-Si), or the like. The portion of the fin structure 125 underlying the dummy gate structure 150 may be referred to as the channel region. The dummy gate structure 150 may also define source/drain regions of the fin structure 125.

Gate spacers 158 are formed on sidewalls of the dummy gate structure 150. The gate spacer 158 may include a dielectric material such as silicon oxide, silicon nitride, silicon carbide, silicon oxynitride, SiCN films, silicon oxycarbide, SiOCN films, and/or combinations thereof. Exposed portions of the fin structure 125 that extend laterally beyond the gate spacers 158 (e.g., in source/drain regions of the fin structure 125) are etched by using, for example, an anisotropic etching process that uses the dummy gate structure 150 and the gate spacers 158 as an etch mask, resulting in recesses R1 into the fin structure 125. Subsequently, epitaxial layers 122_a_ and 122_b_ are laterally or horizontally recessed by using suitable etch techniques, resulting in lateral recesses R2. Inner dielectric spacers 159 are filled in the recesses R2. The spacer material layer may include, such as $SiO_2$, SiN, SiC, SION, SiCN, or SiOCN, and may be formed by a suitable deposition method, such as ALD.

Subsequently, first source/drain epitaxial structures 160 can be formed on bottoms of the recesses R1 and connected to the epitaxial layers 124_a_. An interlayer dielectric (ILD) layer 174 is formed over the substrate 110. In some embodiments, a contact etch stop layer (CESL) 172 is also formed prior to forming the ILD layer 174. In some examples, the CESL 172 can be made of a dielectric material, such as silicon nitride, silicon oxide, silicon oxynitride, and/or other suitable materials, having a different etch selectivity than the ILD layer 174. In some embodiments, the CESL 172 and the ILD layer 174 can be collectively referred to as an isolation structure 170.

Second source/drain epitaxial structures 165 are formed over the isolation structure 170. The second (and/or first) source/drain epitaxial structures 165 may be formed by performing an epitaxial growth process that provides an epitaxial material on the isolation structure 170. In some embodiments, the second (and/or first) source/drain epitaxial structures 165 (and/or 160) may include Ge, Si, GaAs, AlGaAs, SiGe, GaAsP, SiP, or other suitable material. The second (and/or first) source/drain epitaxial structures 165 (and/or 160) may be doped by introducing doping species including: p-type dopants, such as boron or $BF_2$; n-type dopants, such as phosphorus or arsenic; and/or other suitable dopants including combinations thereof. In some exemplary embodiments. In some embodiments, the first source/drain epitaxial structures 160 and/or the second source/drain epitaxial structure 165 can be interchangeably referred to as a source/drain pattern or an epitaxial pattern. An ILD layer 178 is formed over the substrate 110. In some embodiments, a CESL 176 is formed prior to forming the ILD layer 178. In some embodiments, the CESL 176 and the ILD layer 178 are substantially similar to the CESL 172 and the ILD layer 174 in terms of their material and manufacturing methods.

Figure 3:
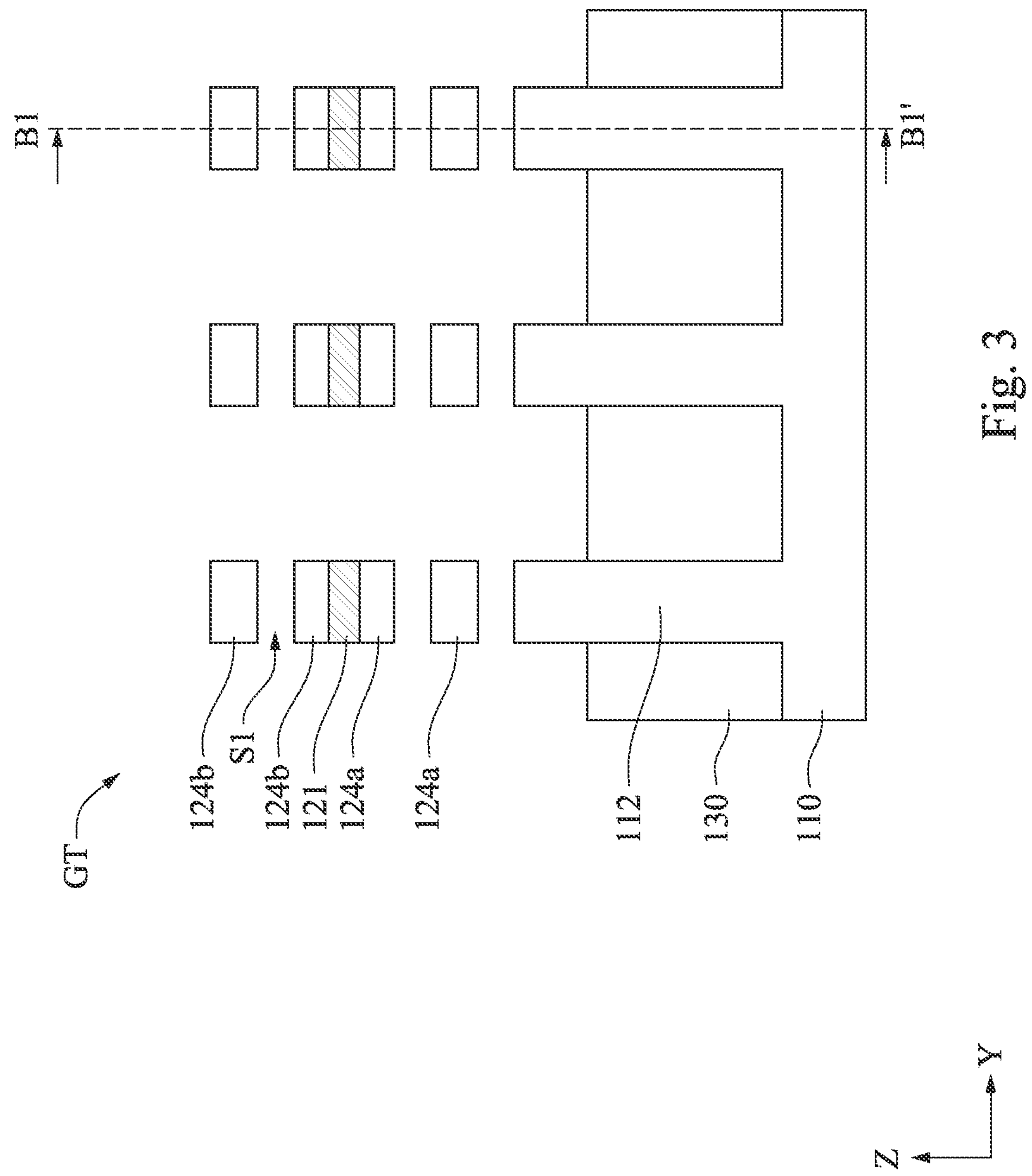

Reference is made to FIG. 3. The dummy gate dielectric layer 152, the dummy gate electrode layer 154, and the hard mask layer 156 are removed first, and then the epitaxial layers (i.e., sacrificial layers) 122_a_ and 122_b_ are removed. The resulting structure is illustrated in FIG. 3, and spaces S1 can be formed between neighboring epitaxial layers (i.e., channel layers) 124_a_ and 124_b_.

Figure 4:
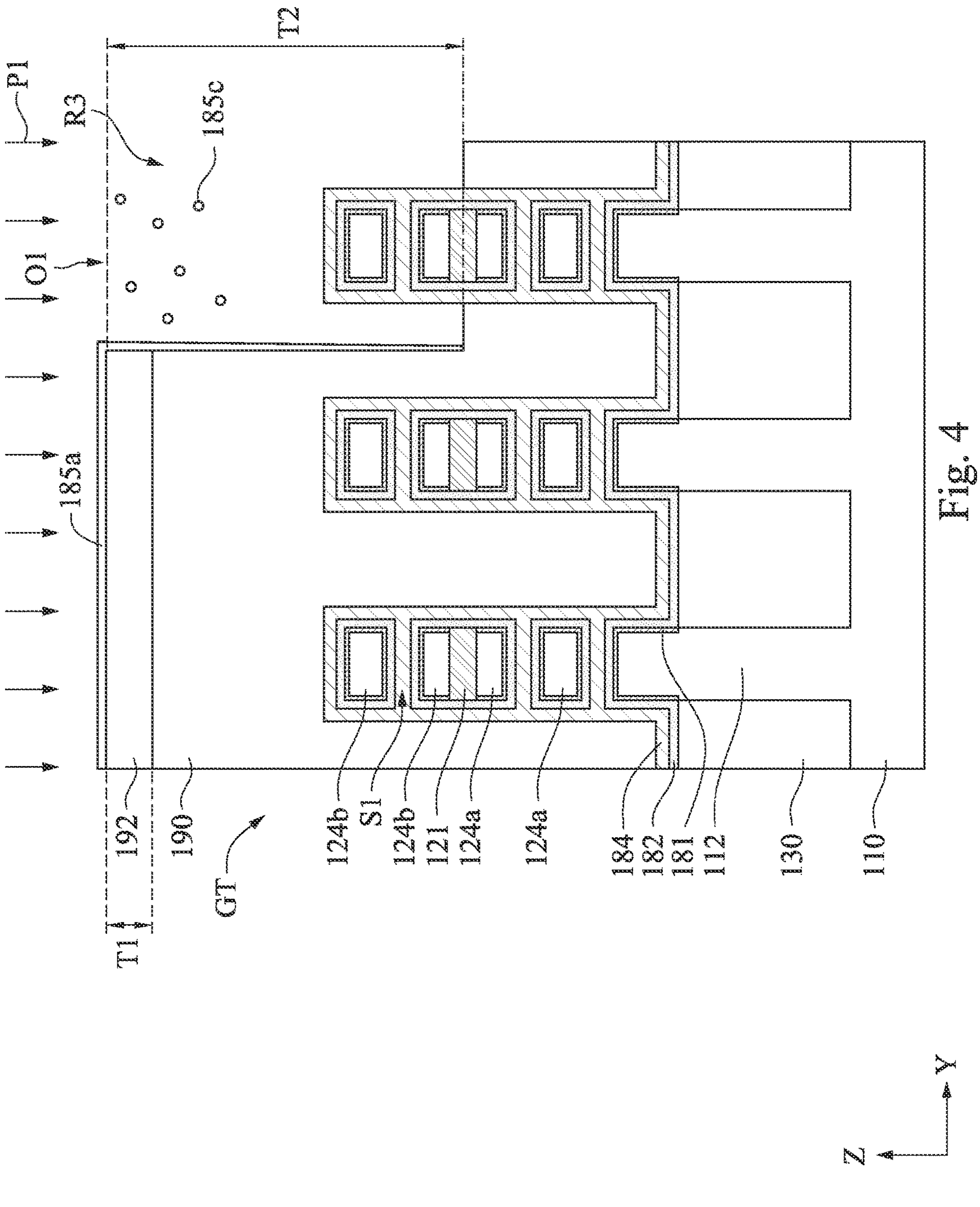

Reference is made to FIG. 4. An interfacial layer 181 is formed around the epitaxial layers 124_a_ and 124_b_, and a high-k dielectric layer 182 is formed over the interfacial layer 181. Specifically, the interfacial layer 181 may include oxide layers such as silicon oxide layers, which are formed through a thermal oxidation process or a chemical oxidation process to oxidize the surface portions of the epitaxial layers 124*a* and 124*b* and the protruding portion 112. Subsequently, a high-k dielectric layer 182 is deposited over the interfacial layer 181. The high-k dielectric layer 182 may be formed of a high-k dielectric material such as hafnium oxide ($HfO_2$), zirconium oxide ($ZrO_2$), titanium oxide ($TiO_2$), or the like. In some embodiments, the high-k dielectric layer 182 can be formed using ALD or CVD.

Subsequently, a barrier layer 184 is conformally formed over the high-k dielectric layer 182 and fills into the spaces S1. After the formation of the barrier layer 184, a dipole layer 186 (see FIG. 7) can be deposited over the barrier layer 184. The function of the barrier layer 184 is to prevent these dipole dopants in the dipole layer 186 from diffusing into the underlying high-k dielectric layer 182 (FIG. 7). In some embodiments, the barrier layer 184 is made of a different material than the high-k dielectric layer 182 and the dipole layer 186 (see FIG. 7). By way of example and not limitation, the barrier layer 184 may include $Al_2O_3$, $HfO_2$, $ZrO_2$, $La_2O_3$, other suitable materials, or combinations thereof. In some embodiments, the barrier layer 184 may include TiN, TaN, TaC, combinations thereof, or multi-layers thereof. In some embodiments, the barrier layer 184 are formed using ALD or CVD.

Subsequently, a dummy material 190 is deposited over the substrate 110 and fills in the gate trench GT. By way of example and not limitation, the dummy material 190 may be formed of a bottom antireflective coating (BARC). In some embodiments, the dummy material 190 may be a low-k dielectric material, such as $SiO_2$, SiN, SiC, SION, SiCN, or SiOCN, and may be formed by a suitable deposition method, such as ALD, CVD, or PVD. In some embodiment, the dummy material 190 may have a carbon atomic concentration greater than about 3%. In some embodiments, the dummy material 190 can be interchangeably referred to as a sacrificial layer.

Subsequently, a patterned mask layer 192 is formed over the dummy material 190 and has an opening $O_1$ to expose the barrier layer 184 to be patterned underlying the dummy material 190. In some embodiments, the mask layer 192 is formed by spin coating a resist material (e.g., the mask layer 192 may be also referred to as a photo resist layer). By way of example and not limitation, the mask layer 192 may have a thickness T1 in a range from about 2 to 15 nm. After forming the mask layer 192 on the dummy material 190, the mask layer 192 is patterned as shown in FIG. 4.

Figure 5A:
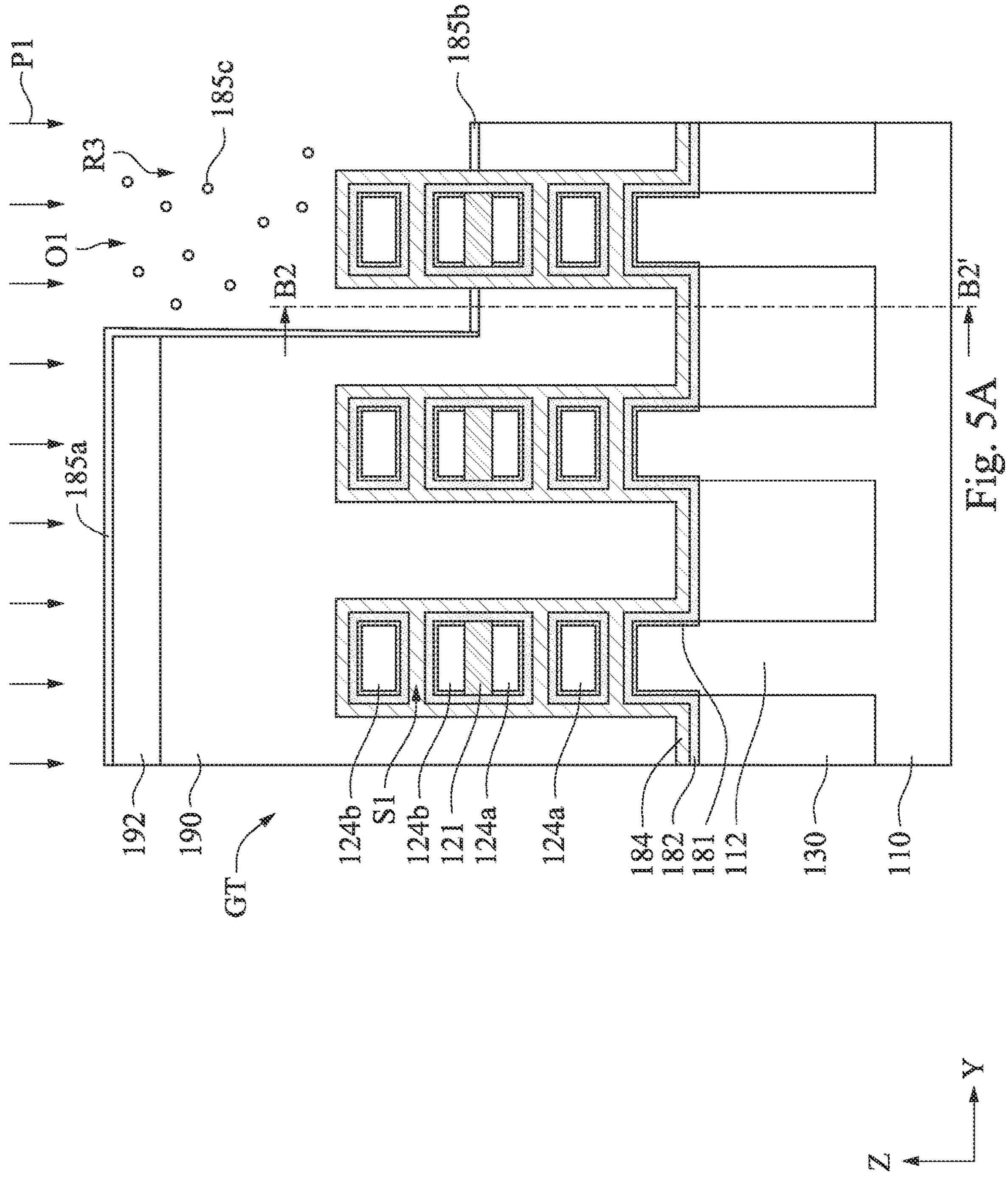

Reference is made to FIGS. 4, 5A, and 5B. FIGS. 4, 5A, and 5B illustrate a stage where an etching back process P1 is performed on the dummy material 190 to create a recess R3. The etching back process P1 is performed to expose the barrier layer 184 that overlays the epitaxial layers 124*b*. Once exposed, this barrier layer 184 is then removed (see FIG. 6), revealing the high-k dielectric layer 182 situated over the epitaxial layers 124*b*. This step is for the subsequent drive-in of the dipole dopant into the high-k dielectric layer 182 (see FIG. 7).

The etching back process P1 can be executed in two distinct phases. The first phase of the etching back process P1 can be shown in FIG. 4. During this phase, the etching back process P1 targets the dummy material 190, etching it downwards. Concurrently, a passivation layer 185*a* (see FIG. 4) can be selectively formed on the sidewalls of the recess R3. This passivation layer 185*a* can be act as it prevents the etching back process P1 from inadvertently etching into the structures lying beneath the patterned hard mask layer 192.

The second phase of etching back process P1 can be shown in FIGS. 5A and 5B: In this subsequent phase, the etching back process P1 continues, but now with an additional focus on forming another passivation layer 185*b* at the bottom of the recess R3. This passivation layer 185*b* can act as a stop layer, halting the downward etching of the dummy material 190. Simultaneously, this stage also involves the removal of a remainder 190*r* of the dummy material 190 that presents on the barrier layer 184 (see FIG. 5B). The removal of this residual dummy material 190 can be as it ensures that the subsequent barrier layer removal process (see FIG. 6) can proceed without obstruction, thereby preventing interference with the removal of the barrier layer 184.

Reference is made to FIG. 4. The etching back process P1, which targets the dummy material 190, can be managed by controlling the duration of the process. This controlling is to ensure that the etching can halt at a predetermined level, such that the top surface of the etched-back dummy material 190 can align with the isolation layer 121 (see FIG. 2B) situated between the epitaxial layers 124*a* and 124*b*. In some embodiments, the etching back process P1 may be performed by using a plasma processing apparatus. In some embodiments, the first phase of the etching back process P1 can be an anisotropic dry etching process (e.g., a reactive-ion etching (RIE) process or an atomic layer etching (ALE) process), where material is removed more in one direction (e.g., vertical direction) than in others. By way of example and not limitation, the etching back process P1 may implement an etching gas, such as an oxygen-containing gas, a fluorine-containing gas (e.g., $CF_4$, $SF_6$, $CH_2F_2$, $CHF_3$, $CH_3F$ and/or $C_4F_8$), a chlorine-containing gas (e.g., $Cl_2$ and/or $BCl_3$), a bromine-containing gas (e.g., HBr), an iodine-containing gas, other suitable gases and/or plasmas, and/or combinations thereof.

The etching back process P1 can include adjusting the relative power levels of DC power and bias power providing by the DC source power supply and the RF power supply of the plasma processing apparatus, and the DC power and the bias power can be applied to the substrate 110 during the etching back process P1 to achieve the desired etching profile. By controlling the DC power and the bias power, the etching back process P1 can allow for the selective etching on the substrate 110, resulting in anisotropic etching behavior. In the etching back process P1, plasma is used to remove material from the substrate 110 by bombarding it with ions or radicals. In some embodiments, the plasma processing apparatus 10 may contain an inductively-coupled plasma (ICP) as a plasma source and a RF power supply as a bias power source. An ICP plasma coil above the substrate 110 is connected to the DC source power supply 26. A pedestal assembly below the substrate 110 is connected to an RF power supply providing the bottom bias power.

During the etching back process P1, there is a potential risk of etching damage to the structure underlying the patterned mask layer 192. This risk may arise when the dummy material 190 is etched in the Y-direction. To address this issue, while etching the dummy material 190, the passivation layer 185*a* can be selectively formed on the sidewalls of the recess R3 and act as a protective barrier. The formation of the passivation layer 185*a* can involve introducing a precursor 185*c* (see FIG. 4). In some embodiment, the precursor 185*c* may include a carbon-containing precursor, such as hydrocarbon ($CH_4$). This precursor 185*c* can be readily adsorbed onto the dummy material 190 (and/or mask layer 192), facilitating the formation of the passivation layer 185*a*. This precursor 185*c* can be less to (or does not) deposit or adhere to the barrier layer 184. In some embodiments, the precursor 185*c* can be broken down into reactive species (e.g., radicals) and adsorbed onto the dummy material 190 (and/or patterned mask layer 192). The precursor 185*c* can have an affinity towards other carbon-containing materials. When precursor 185*c* encounter a carbon-rich surface, they tend to adhere due to this affinity, minimizing the total energy of the system. In some embodiments, the recess R3 may have a depth T2 measured form a top surface of the mask layer 192 to the bottom of the recess R3. By way of example and not limitation, the depth may be in a range from about 100-160 nm, such as about 100, 110, 120, 130, 140, 150, or 160 nm.

In the etching back process P1, before reaching the predetermined depth, the passivation layer 185*a* could form at the bottom of the recess R3. If this happens, it can hinder the etching process, preventing further reduction of the dummy material 190 to the predetermined depth. To address this, the method can include the adjustment of radio frequency (RF) bias intensity during the first phase thereof. By increasing the RF bias intensity, compared to the settings used later in the etching back process P1 (see FIGS. 5A and 5B), the ion plasma's bombardment capacity can be enhanced. This intensified ion bombardment can be directed downwards, effectively removing unintended passivation layer that may have formed at the bottom of the recess R3. Therefore, during the first phase of etching back process P1, the passivation layer 185*a* can be formed on the sidewalls of recess R3, rather than at its bottom, allowing the etching process to proceed to the predetermined depth without obstruction. Alongside the RF bias, increasing the RF bias might require a reduction in plasma power (e.g., DC Power) to prevent over-etching or damage to the substrate 110. RF Bias can control the energy and directionality of ions in the plasma. DC Power can govern the generation and maintenance of the plasma itself, affecting the density and characteristics of the plasma.

Additionally, during the first phase of the etching back process P1, the concentration of the precursor 185*c* may be higher near the top surface of the patterned mask layer 192 compared to lower positions. This higher concentration may lead to more precursors 185*c* being deposited and adsorbed on the top surface of the patterned mask layer 192. This occurrence may help maintain the integrity of the mask layer 192. In some embodiments, the thickness of the remaining passivation layer 185*a* on the patterned mask layer 192 may tend to be greater than that on the sidewall of the recess R3.

In some embodiments, for devices with wider gate trenches GT, the more rapid etching rate might result in the unintentional exposure of the epitaxial layer 124*a*. Conversely, for devices with narrower gate trenches GT, the slower etching rate could mean that the epitaxial layer 124*b* remains unexposed after the same etching duration. Therefore, the method disclosed in FIG. 4 can address this challenge by controlling the DC power and RF power during the first phase of the etching back process P1, which lies in periodically turning both the bias power and the DC power on and off simultaneously. Specifically, during the periods when both the bias power and DC power are turned off, the etching gas within the etching back process P1 can distribute more evenly across both the wide and narrow gate trenches GT. This even distribution can allow for a more uniform interaction between the etching gas and the dummy material 190, regardless of the different gate widths, and across different regions of the wafer. Subsequently, when the bias power and DC power are reactivated, the etching back process P1 can resume with a more balanced etching rate across all gate trenches GT, regardless of their different gate widths, and across different regions of the wafer. This method can ensure that the etching rate of the dummy material 190 in both wide and narrow gate trenches GT can align more closely, leading to a uniform depth of recesses R3 across different devices, which in turn ensures a consistent device performance and reliability across the semiconductor wafer.

During the etching back process P1, the process parameters can be adjusted to achieve etching control. In some embodiments, the source power of the etching back process P1 can be set in a range from about 600-1000 W, such as about 600, 650, 700, 750, 800, 850, 900, 950, or 1000 W. This source power is coupled with a pulsing frequency in a range from about 80-120 Hz, such as about 80, 85, 90, 95, 100, 105, 110, 115, or 120 Hz, and with a duty cycle of about 40-60%, such as about 40, 45, 50, or 60%. This setting of the source power can ensure adequate energy for the plasma generation while the pulsing frequency and duty cycle can help in managing the plasma density and energy distribution for controlled etching. In some embodiments, the bias power of the etching back process P1 can be set in a range from about 20-60 W, such as about 20, 25, 30, 35, 40, 45, or 60 W. This bias power also is coupled with a pulsing frequency in a range from about 80-120 Hz, such as about 80, 85, 90, 95, 100, 105, 110, 115, or 120 Hz, and with a duty cycle of about 40-60%, such as about 40, 45, 50, or 60%. This setting of the bias power can ensure adequate ion energy and directionality on the etching and can help in refining the etch profile.

In some embodiments, the etching back process P1 can be performed under a pressure in a range from about 5-30 millitorr (mT), such as about 5, 10, 15, 20, 25, or 30 mT. The gas composition for the etching back process P1 may include argon (Ar), nitrogen ($N_2$), and hydrogen ($H_2$). By way of example and not limitation, the argon can be provided at a flow rate in a range from about 20-70 mL/min, such as about 20, 25, 30, 35, 40, 45, 50, 55, 60, 65, or 70 mL/min. The nitrogen can be provided at a flow rate in a range from about 100-300 mL/min, such as about 100, 120, 140, 160, 180, 200, 220, 240, 260, 280, or 300 mL/min. The hydrogen can be provided at a flow rate in a range from about 500-1000 mL/min, such as about 500, 600, 700, 800, 900, or 1000 mL/min. These carefully calibrated settings in the first phase of the etching back process P1 ensure that the etching is carried out with precision, minimizing damage to the underlying structures while achieving the desired etch depth and profile.

As shown in FIGS. 5A and 5B, during the second phase of the etching back process P1, remaining dummy material 190 that overlies the barrier layer 184 can be removed. Additionally, in the second phase of the etching back process P1, a passivation layer 185*b* can be selectively formed at the bottom of the recess R3, while concurrently facilitating the etching of dummy material that remains on the barrier layer 184. This process can involve a reduction in the intensity of the RF bias, or turning off the bias power entirely, which in turn allows for diminishing the downward bombardment capability of the ion plasma. Therefore, the passivation layer 185*b* can be formed at the bottom of recess R3 without being completely etched by the ion plasma. After the formation of the passivation layer 185*b* at the bottom of the recess R3, the ion plasma can strike the passivation layer 185*b* at an oblique angle, effectively bouncing upwards.

Reference is made to FIG. 6. An etching process is performed to remove the exposed barrier layer 184 from the passivation layers 185*a* and 185*b* to expose the underlying high-k dielectric layer 182. In some embodiments, the etching process is performed through wet etching. For example, the wet etching chemical may include an acid such as HCl, $H_2SO_4$, $H_2CO_3$, HF, for the like. Subsequently, the dummy material 190, the mask layer 192. and the passivation layers 185*a* and 185*b* can be removed Reference is made to FIG. 7. The dipole layer 186 can be deposited over the substrate 110 in a deposition process. The dipole layer 186 can be formed through a conformal deposition process such as an ALD process or a CVD process. The dipole layer 186 may include a dipole dopant, such as lanthanum, aluminum, yttrium, Titanium, Magnesium, Niobium, Gallium, Indium or the like. These elements, when diffused into the high-k dielectric layer 182, may increase the number of dipoles, and result in the change in threshold voltages (Vts) of the respective CFETs. The dipole layer 186 may be oxides and/or nitrides of the dipole dopant. For example, the La-containing dipole layer 186 may be in the form of lanthanum oxide ($La_2O_3$), lanthanum nitride (LaN), or the like, or combinations thereof. The Al-containing dipole layer 186 may be in the form of aluminum oxide ($Al_2O_3$), aluminum nitride (AlN), or the like, or combinations thereof.

A drive-in annealing process P2 is performed. The annealing temperature may be in the range between about 500° C. and about 950° C. The annealing results in the dipole dopant to be driven into high-k dielectric layer 182. The high-k dielectric layer 182 has a portion doped with the dipole dopant, and the portion thereof can be referred to as (dipole-dopant containing) high-k dielectric layer 182'. Therefore, the selective diffusion of the dipole dopant into the high-k dielectric layer 182 of the CFET can be achieved. The high-k dielectric layer 182' can be in a top-tier transistor 196*b* (see FIG. 8A) of the CFET. Concurrently, the high-k dielectric layer 182 in the bottom-tier transistor 196*a* of the same CFET can remain undoped with the dipole dopant (or doped with a different dopant than the dipole dopant). In other words, the high-k dielectric layer 182 in the bottom-tier transistor 196*a* of the same CFET can be free of the dipole dopant. In some embodiments, the high-k dielectric layer 182' in the top-tier transistor 196*b* has a higher dipole dopant atomic concentration than the high-k dielectric layer 182 in the bottom-tier transistor 196*a*. This selective doping can alter the threshold voltage of the top-tier transistor 196*b*, making it distinct from the bottom-tier transistor 196*a*.

Furthermore, this partial diffusion of dipole dopant into the high-k dielectric layer 182 can enable the tuning of the threshold voltage of the transistor, thus facilitating the creation of transistors with specific electrical properties, such as p-type or n-type. In some embodiments, the metal gate electrode 188 for both the top-tier transistor 196*b* (see FIG. 8A) and bottom-tier transistor 196*a* (see FIG. 8A) within the same CFET (as shown in FIG. 8A) can be made of the same material. In some embodiments, different materials can be used for the metal gate electrodes 188 of the top-tier and bottom-tier transistors 196*b* and 196*a* within the same CFET.

Reference is made to FIGS. 8A and 8B. After the drive-in annealing process P2, the dipole layer 186 is removed in an etching process. In some embodiments, the etching process is performed through wet etching. In some embodiments, the exposed barrier layer 184 can be removed by an etching process as illustrated in FIG. 6, this etching process can refer to the previous figures and related description. Subsequently, a metal gate electrode 188 is deposited over the high-k dielectric layers 182 and 182' and fills in the gate trenches GT and the spaces S1. The metal gate electrode 188 may include a work function metal layer and/or a fill metal formed around the epitaxial layers 124*a* and 124*b*. In some embodiments, the metal gate electrode 188 may exemplarily include, but are not limited to, tungsten, aluminum, copper, nickel, cobalt, titanium, tantalum, titanium nitride, tantalum nitride, nickel silicide, cobalt silicide, TaC, TaSIN, TaCN, TiAl, TiAIN, or other suitable materials. As such, gate structures 180 can be formed. The gate structure 180 can include the interfacial layer 181, the high-k dielectric layer 182/182', and the metal gate electrode 188. In some embodiments, the gate structure 180 can be interchangeably referred to a metal gate, a gate pattern, or a gate strip.

Therefore, the semiconductor structure 100 can be formed to include a bottom-tier transistor 196*a* and a top-tier transistor 196*b* over the bottom-tier transistor 196*a*. The bottom-tier transistor 196*a* can include the epitaxial layers 124*a*, the first source/drain epitaxial structures 160 on opposite sides of the epitaxial layers 124*a* and connected to the epitaxial layers 124*a*, and the gate structure 180 wrapping around the epitaxial layers 124*a*. The top-tier transistor 196*b* can include the epitaxial layers 124*b*, the first source/drain epitaxial structures 165 on opposite sides of the epitaxial layers 124*b* and connected to the epitaxial layers 124*b*, and the gate structure 180 wrapping around the epitaxial layers 124*b*.

Figure 9:
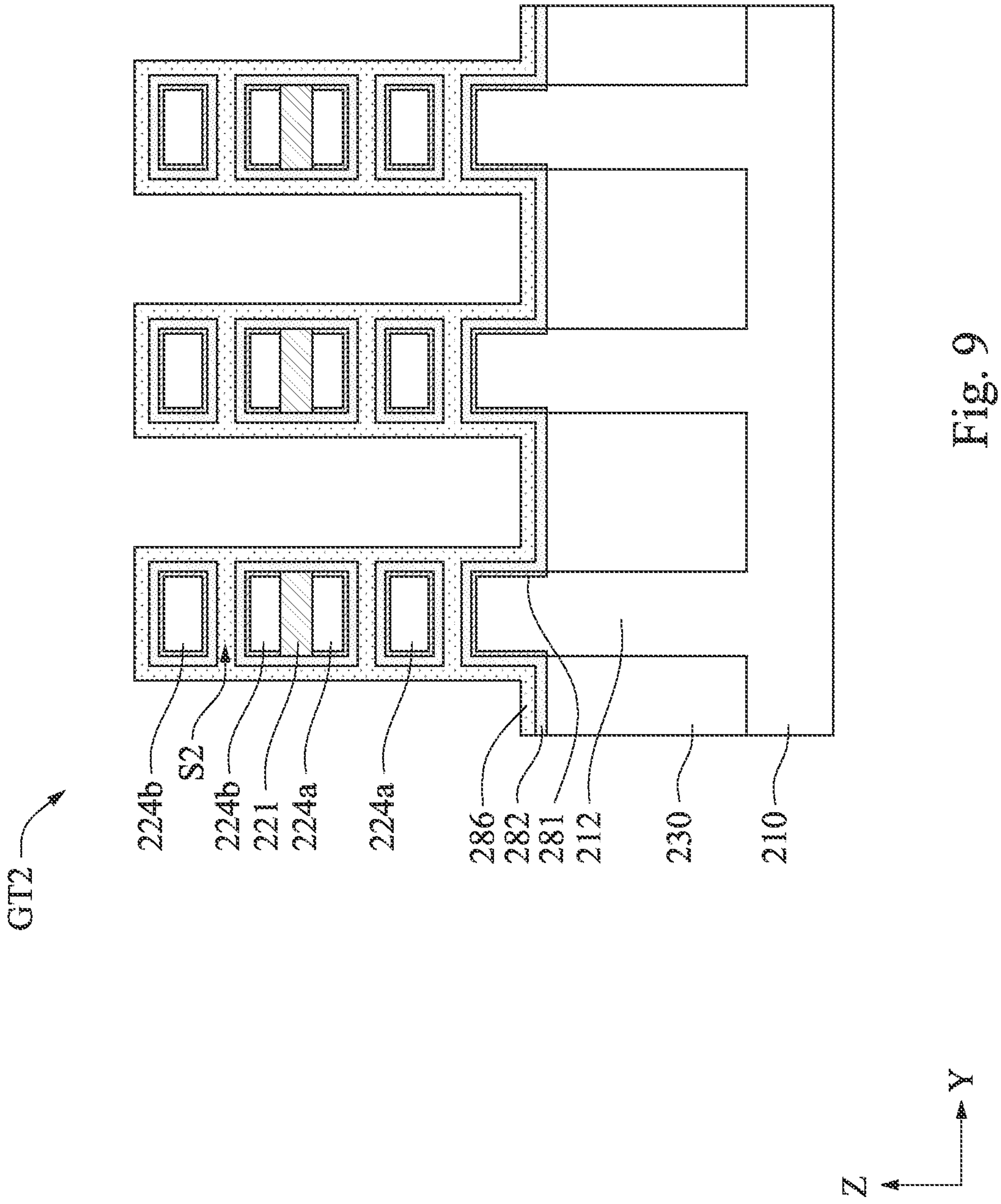
FIGS. 9-16B illustrate schematic views of intermediate stages in the manufacturing of CFETs in accordance with some embodiments.

Reference is made to FIGS. 9-16B. FIGS. 9-16B illustrate cross-sectional views of intermediate stages in the manufacturing of CFETs in accordance with some embodiments. The steps preceding FIG. 9 can correspond to those illustrated in FIGS. 2A-3. In FIG. 9, a substrate 210, a protruding portion 212, an isolation layer 221, epitaxial layers 224*a* and 224*b*, an isolation structure 230, a gate spacer 258, an inner dielectric spacer 259, source/drain epitaxial structures 260 and 265, and isolation structures 270 and 275 can correspond to the substrate 110, the protruding portion 112, the isolation layer 121, the epitaxial layers 124*a* and 124*b*, the isolation structure 130, the gate spacer 158, the inner dielectric spacer 159, the source/drain epitaxial structures 160 and 165, and the isolation structures 170 and 175 in FIGS. 2A-3.

Figure 14:
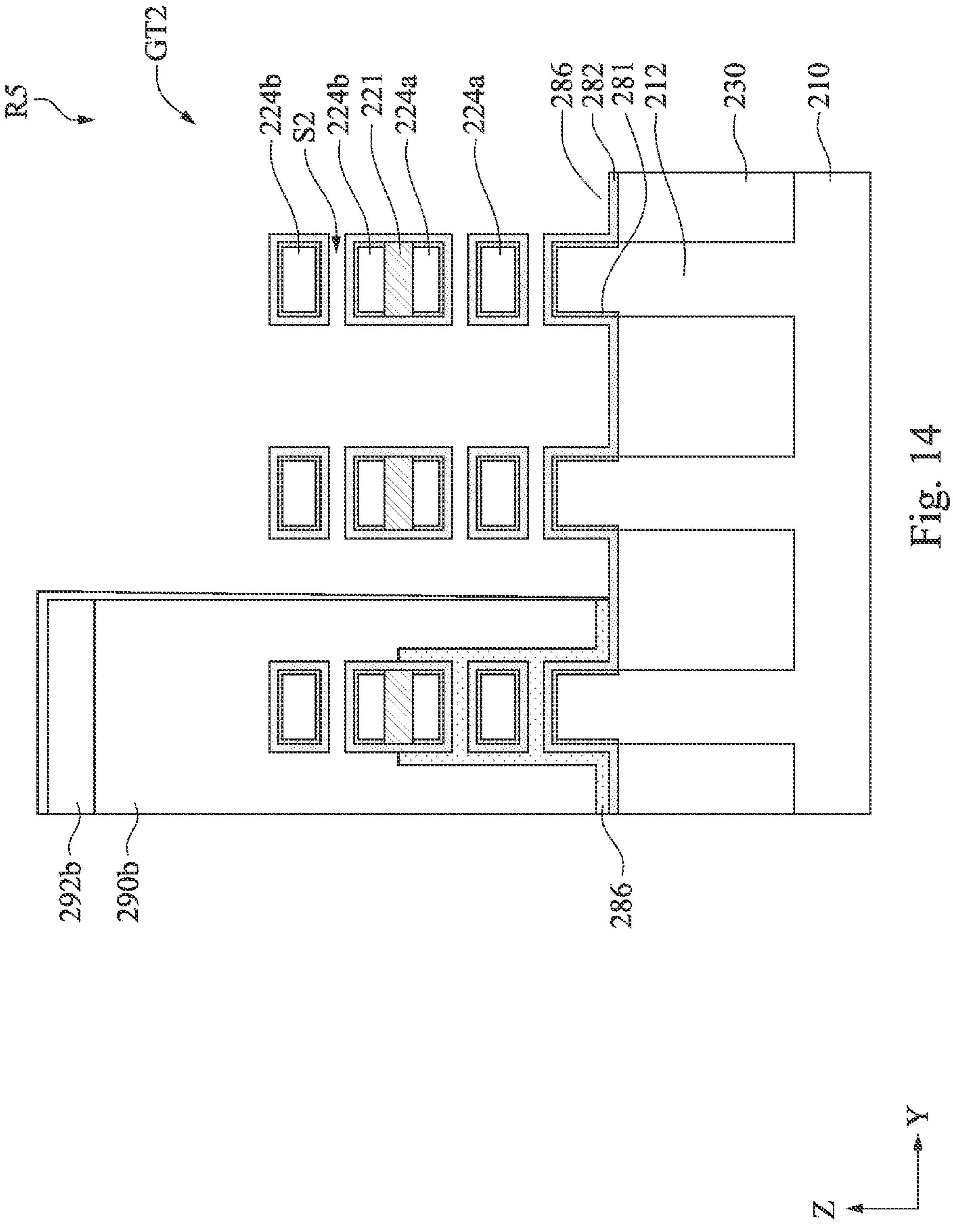
Figure 15:
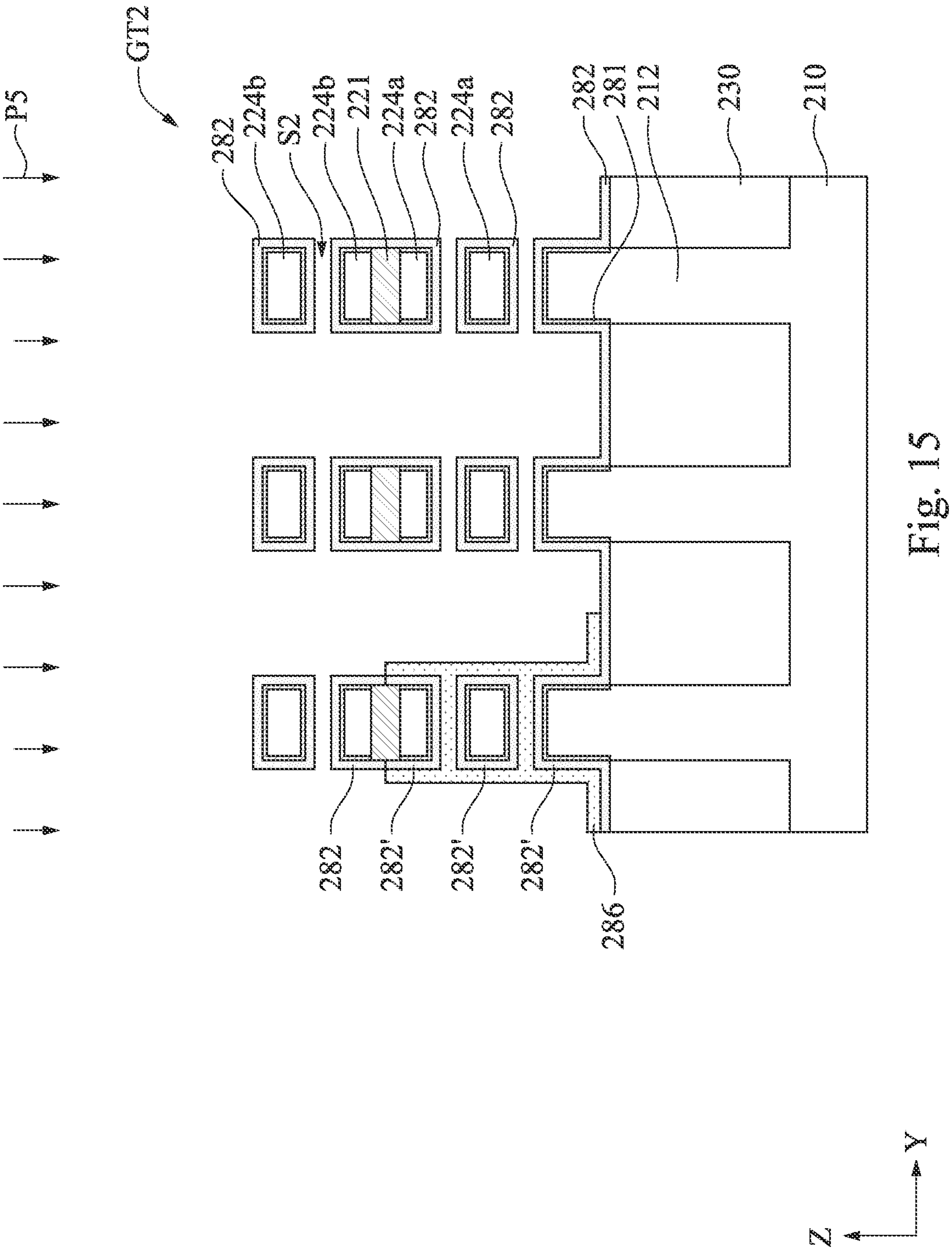
Figure 16A:
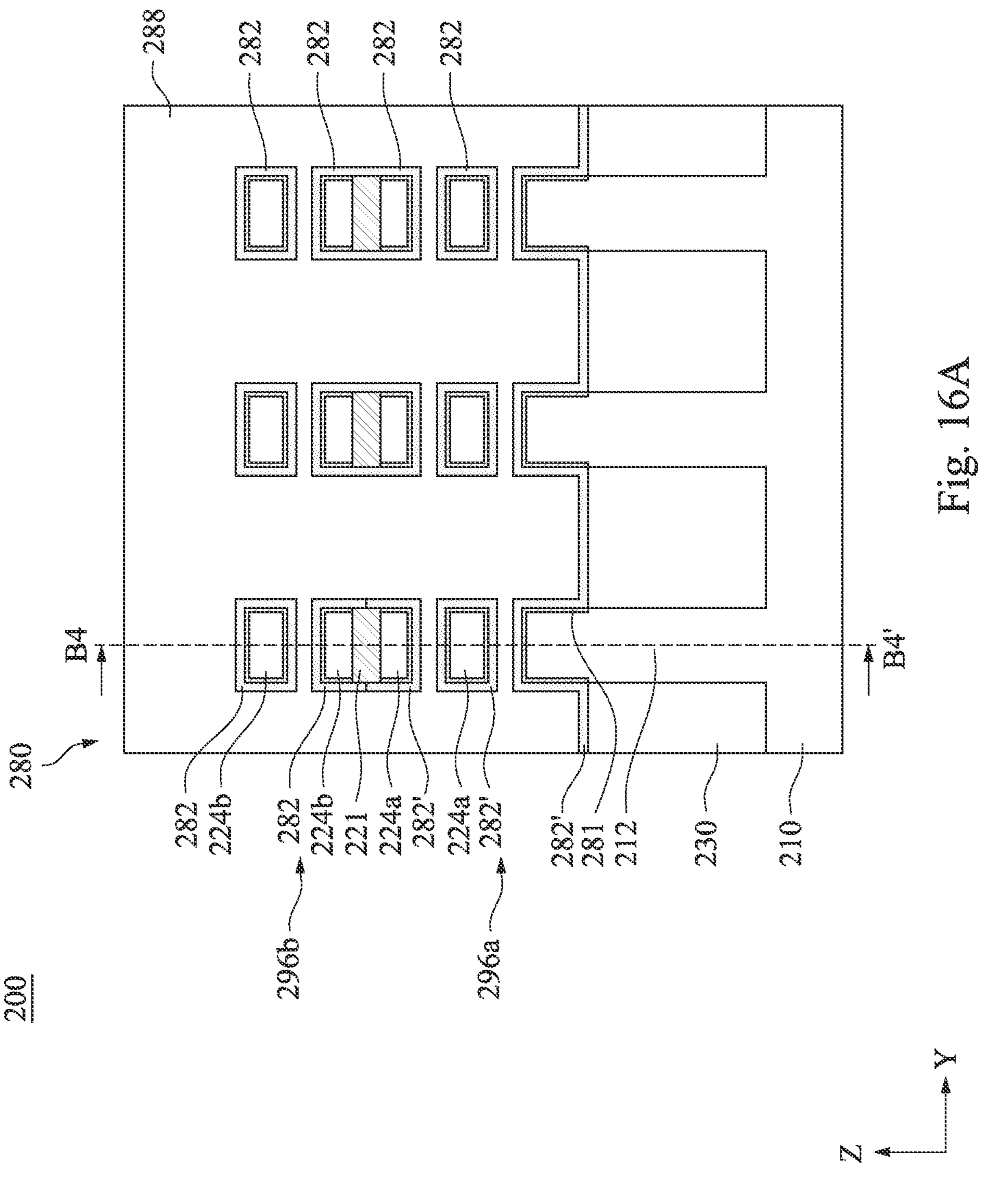
Figure 16B:
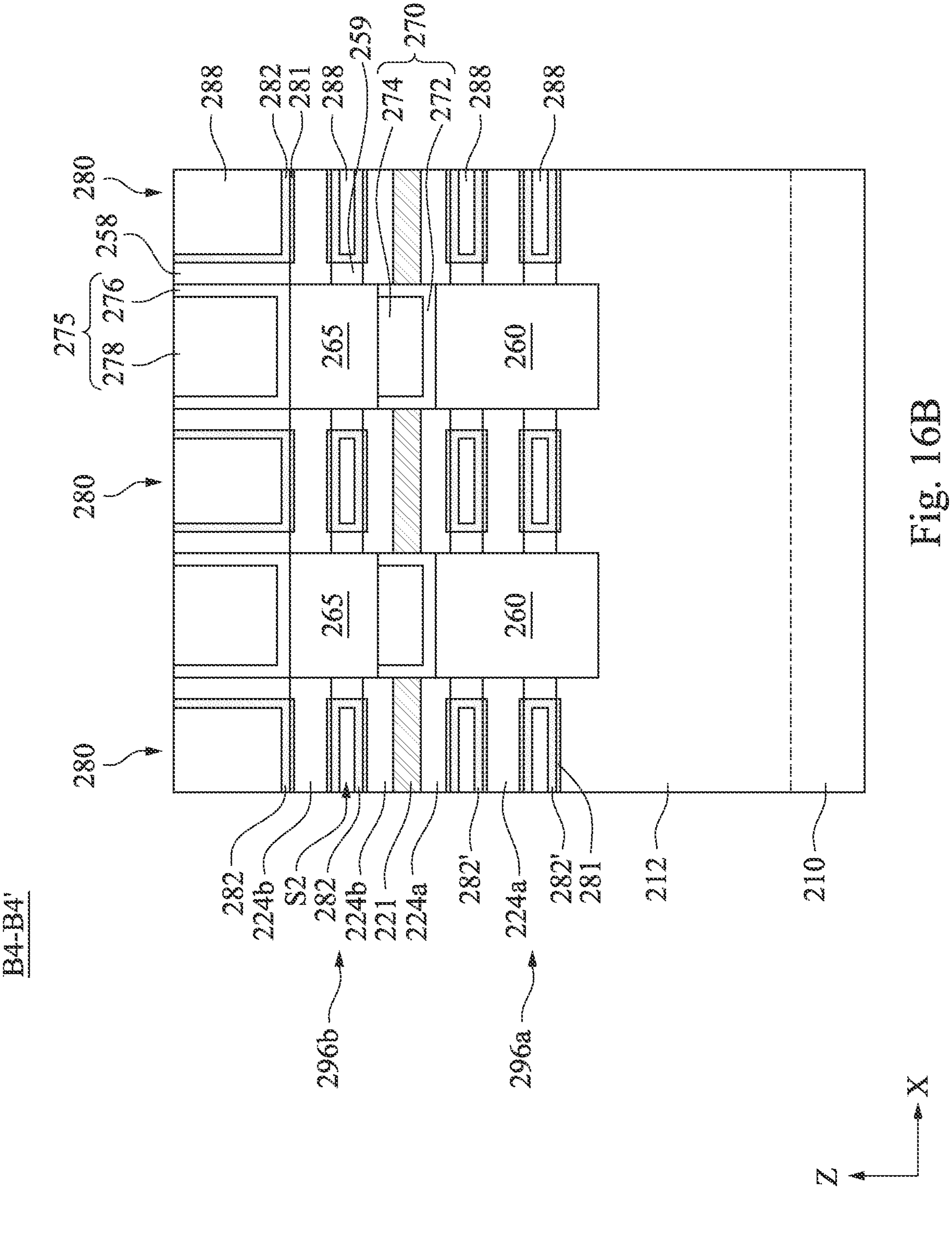

FIGS. 9, 10, 11, 12, 13, 14, 15, and 16A illustrate cross-sectional views along a similar cross-section as reference cross-section A-A' in FIG. 1. FIG. 16B illustrates a cross-sectional views taken along line B4-B4' as shown in FIG. 16A.

Reference is made to FIG. 9. An interfacial layer 281 is formed around the epitaxial layers 224*a* and 224*b*, and a high-k dielectric layer 282 is formed over the interfacial layer 281. Subsequently, a dipole layer 286 is conformally formed over the high-k dielectric layer 282 and fills into the spaces S2 between neighboring epitaxial layers 224*a* and 224*b*. In some embodiments, the interfacial layer 281, the high-k dielectric layer 282, and the dipole layer 286 can correspond to the interfacial layer 181, the high-k dielectric layer 182, and the dipole layer 186 in FIGS. 4 and 7.

Figure 10:
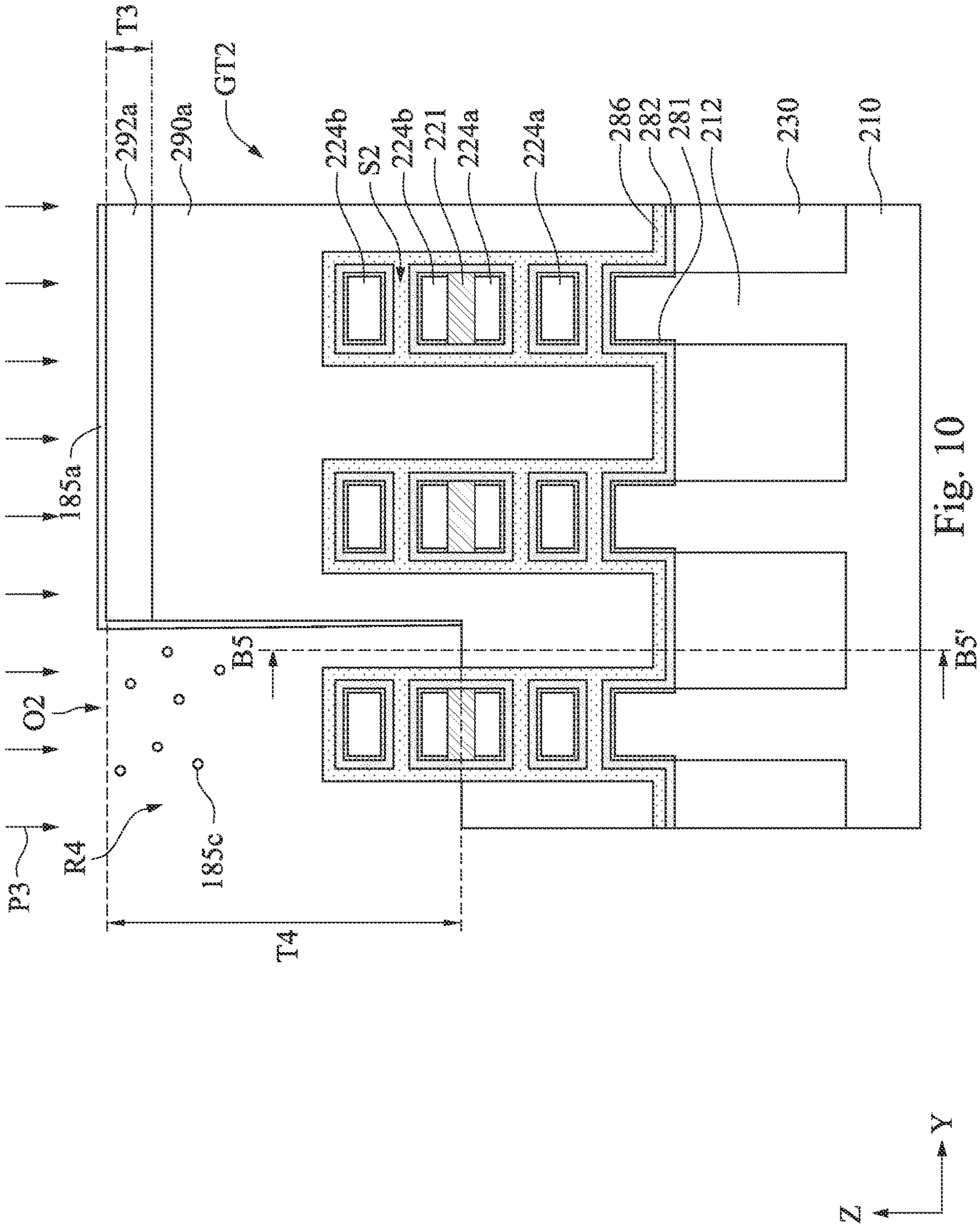

Reference is made to FIG. 10. A dummy material 290*a* is deposited over the substrate 210 and fills in the gate trench GT2. A patterned mask layer 292*a* having an opening O2 is formed over the dummy material 290*a* to expose the dipole layer 286 to be patterned underlying the dummy material 290*a*. In some embodiments, the dummy material 290*a* and the mask layer 292*a* can correspond to the dummy material 190 and the mask layer 192 in FIG. 4.

Figure 11:
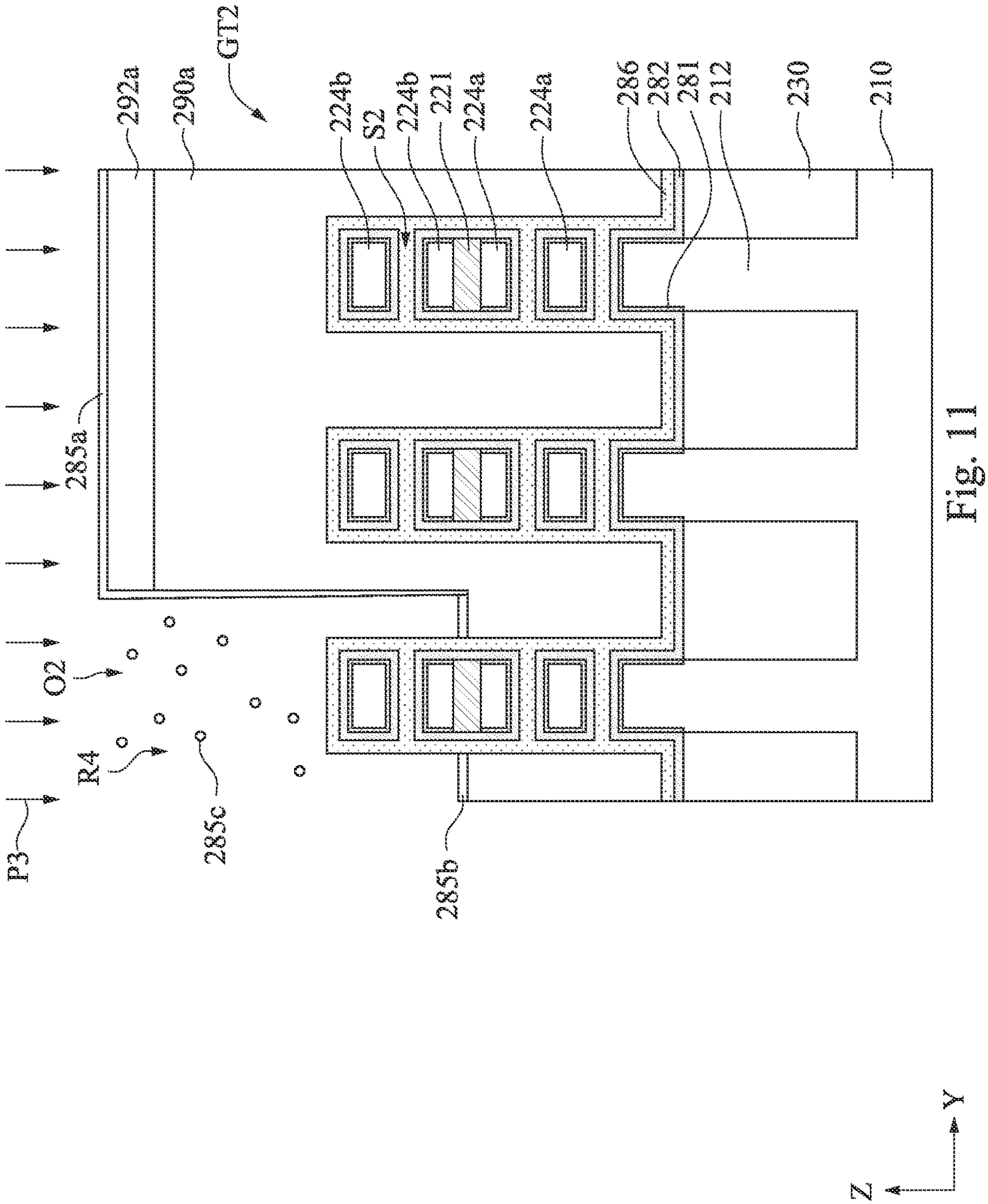

Reference is made to FIGS. 10 and 11. FIGS. 10 and 11 illustrate a stage where an etching back process P3 is performed on the dummy material 290*a* to create a recess R4 to expose the dipole layer 286 The etching back process P3 can be executed in two distinct phases similar to the etching back process P1 (see FIGS. 4-5B). That is, the etching back process P3 can correspond to the etching back process P1 and can refer to the previous figures and related description. Specifically, the first phase of the etching back process P3 can be shown in FIG. 10. During this phase, the etching back process P3 targets the dummy material 290*a*, etching it downwards. Concurrently, a passivation layer 285*a* (see FIG. 10) can be selectively formed on the sidewalls of the recess R4. The formation of the passivation layer 285*a* can involve introducing a precursor 285*c* (see FIG. 10) during the etching back process P3. This precursor 285*c* can be less to (or does not) deposit or adhere to the dipole layer 286. In some embodiment, the precursor 285*c* can correspond to the previous precursor 185*c*.

The second phase of etching back process P3 can be shown in FIG. 11. In this subsequent phase, the etching back process P3 continues, but now with an additional focus on forming another passivation layer 285*b* at the bottom of the recess R4. This passivation layer 285*b* can act as a stop layer, halting the downward etching of the dummy material 290*a*. Simultaneously, this stage also involves the removal of remaining dummy material 290*a* that present on the dipole layer 286. The removal of this residual dummy material 290*a* can be as it ensures that the subsequent dipole layer removal process (see FIG. 12) can proceed without obstruction. In some embodiments, the recess R4 may have a depth T4 measured form a top surface of the mask layer 292*a* to the bottom of the recess R4 as the depth T2 shown in FIG. 4.

Figure 12:
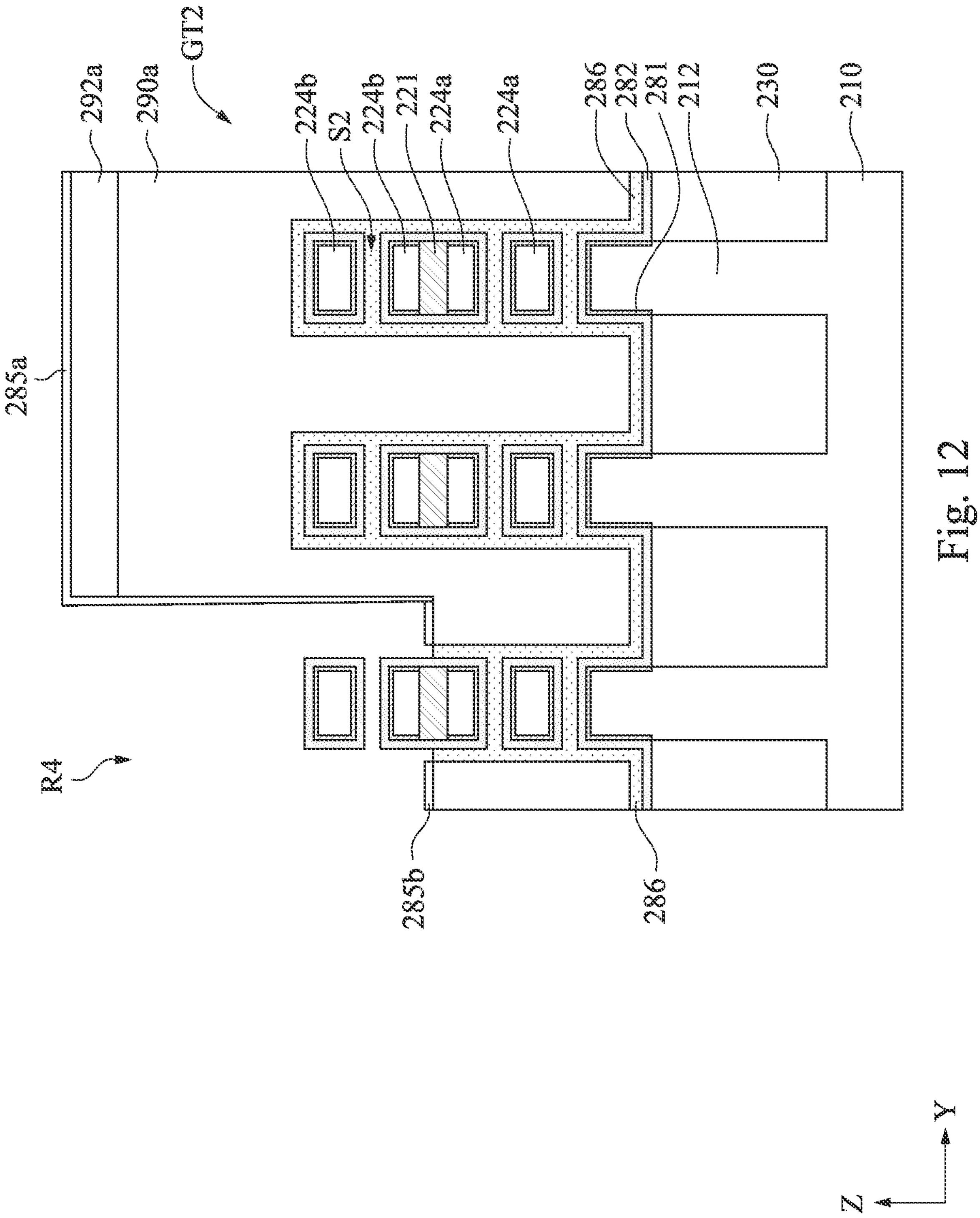

Reference is made to FIG. 12. An etching process is performed to remove the exposed dipole layer 286 from the passivation layers 285*a* and 285*b*. As a result, the high-k dielectric layer 282 can be revealed. In some embodiments, the etching process is performed through wet etching. Subsequently, the dummy material 290*a*, the mask layer 292*a*, and the passivation layers 285*a* and 285*b* can be removed.

Figure 13:
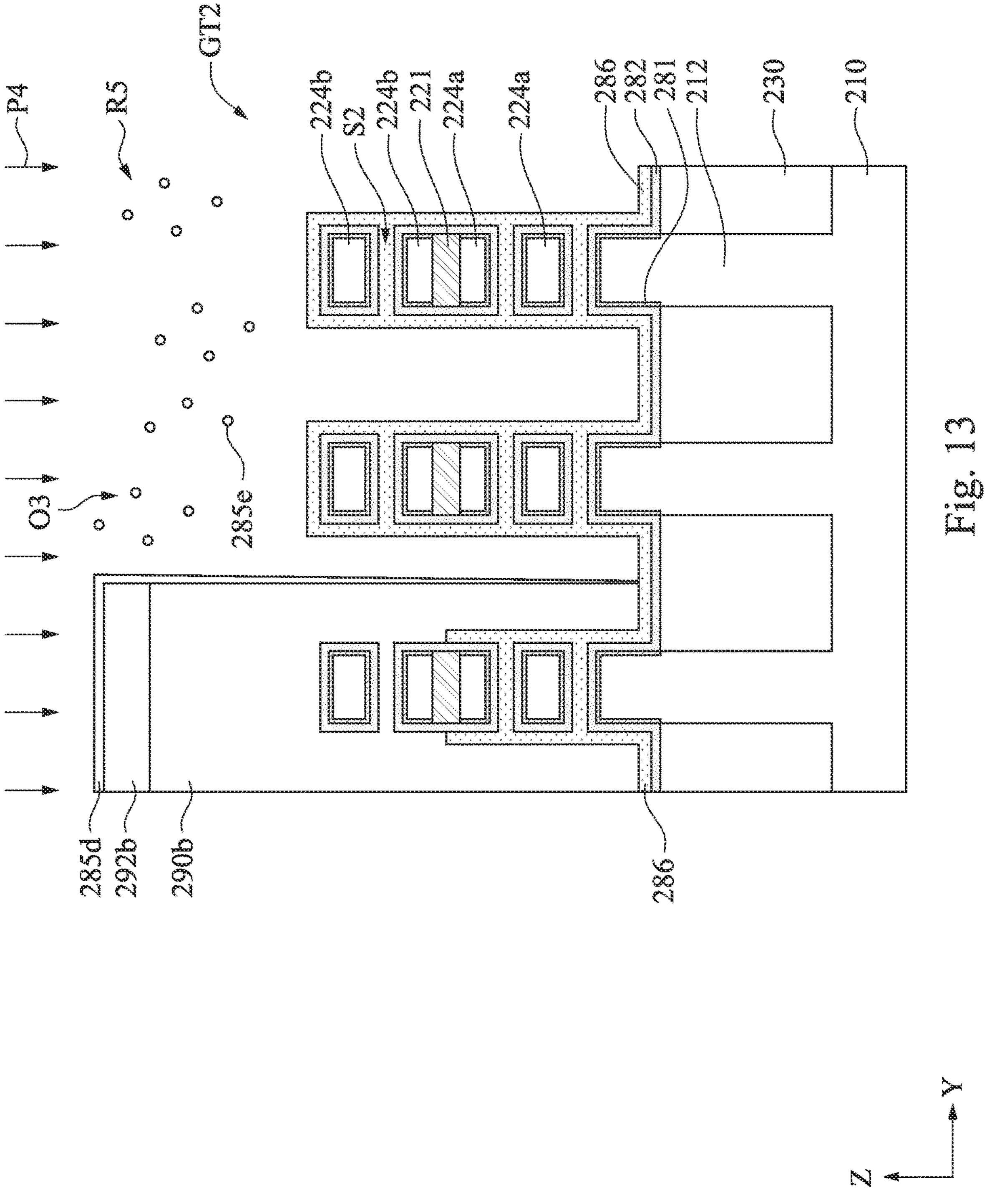

Reference is made to FIG. 13. A dummy material 290*b* is deposited over the substrate 210 and fills in the gate trench GT2. A patterned mask layer 292*b* having an opening O3 is formed over the dummy material 290*b* to expose the dipole layer 286 to be patterned underlying the dummy material 290*b*. In some embodiments, the dummy material 290*b* and the mask layer 292*b* can correspond to the dummy material 190 and the mask layer 192 in FIG. 4.

An etching back process P4 is performed on the dummy material 290*b* to create a recess R5 to expose the dipole layer 286. The etching back process P4 can be executed in two distinct phases similar to the etching back process P1 (see FIGS. 4-5B). That is, the etching back process P4 can correspond to the etching back process P1 and can refer to the previous figures and related description. Specifically, the first phase of the etching back process P4 targets the dummy material 290*b*, etching it downwards. Concurrently, a passivation layer 285*d* (see FIG. 13) can be selectively formed on the sidewalls of the recess R5. This passivation layer 285*d* can be act as it prevents the etching back process P4 from inadvertently etching into the structures lying beneath the patterned hard mask layer 292*b*. The formation of the passivation layer 285*d* can involve introducing a precursor 285*e* (see FIG. 13) during the etching back process P4. In some embodiment, the precursor 285*e* can correspond to the previous precursor 185*c*. The second phase of etching back process P4 can involve the removal of remaining dummy material 290*b* that present on the dipole layer 286. The removal of this residual dummy material 290*b* can be as it ensures that the subsequent dipole layer removal process (see FIG. 14) can proceed without obstruction. As shown in FIG. 13, after the etching back process P4, the exposed dipole layer 286 can be removed by an etching process as illustrated in FIG. 12, and this etching process can refer to the previous figures and related description.

Reference is made to FIG. 14. An etching process is performed to remove the exposed dipole layer 286 from the passivation layer 285*d*. As a result, the high-k dielectric layer 282 can be revealed. In some embodiments, the etching process is performed through wet etching. Subsequently, the dummy material 290*b*, the mask layer 292*b*, and the passivation layer 285*d* can be removed.

Reference is made to FIG. 15. A drive-in annealing process P5 is performed. In some embodiments, the annealing process P5 can correspond to the drive-in annealing process P2 and can refer to the previous figures and related description. The annealing results in the dipole dopant to be driven into high-k dielectric layer 282. The high-k dielectric layer 282 has a portion doped with the dipole dopant, and the portion thereof can be referred to as (dipole-dopant containing) high-k dielectric layer 282'.

Therefore, the selective diffusion of the dipole dopant into the high-k dielectric layer 282 of the CFET can be achieved. The high-k dielectric layer 282' can be in a bottom-tier transistor 296*a* (see FIG. 16A) of the CFET. Concurrently, the high-k dielectric layer 182 in the top-tier transistor 296*b* of the same CFET can remain undoped with the dipole dopant (or doped with a different dopant than the dipole dopant). In some embodiments, the high-k dielectric layer 282' in the bottom-tier transistor 296*a* has a higher dipole dopant atomic concentration than the high-k dielectric layer 282 in the top-tier transistor 296*b*. As shown in FIGS. 16A and 16B, after the drive-in annealing process P5, the exposed dipole layer 286 can be removed by an etching process as illustrated in FIG. 12, and this etching process can refer to the previous figures and related description.

Reference is made to FIGS. 16A and 16B. A metal gate electrode 288 is deposited over the high-k dielectric layers 282 and 282' and fills in the gate trenches GT2 and the spaces S2. In some embodiments, the metal gate electrode 288 can correspond to the metal gate electrode 188 as shown in FIGS. 8A and 8B. As such, gate structures 280 can be formed. The gate structure 280 can include the interfacial layer 281, the high-k dielectric layer 282/282', and the metal gate electrode 288. Therefore, the semiconductor structure 200 can be formed to include a bottom-tier transistor 296*a* and a top-tier transistor 296*b* over the bottom-tier transistor 296*a*.

Figure 17:
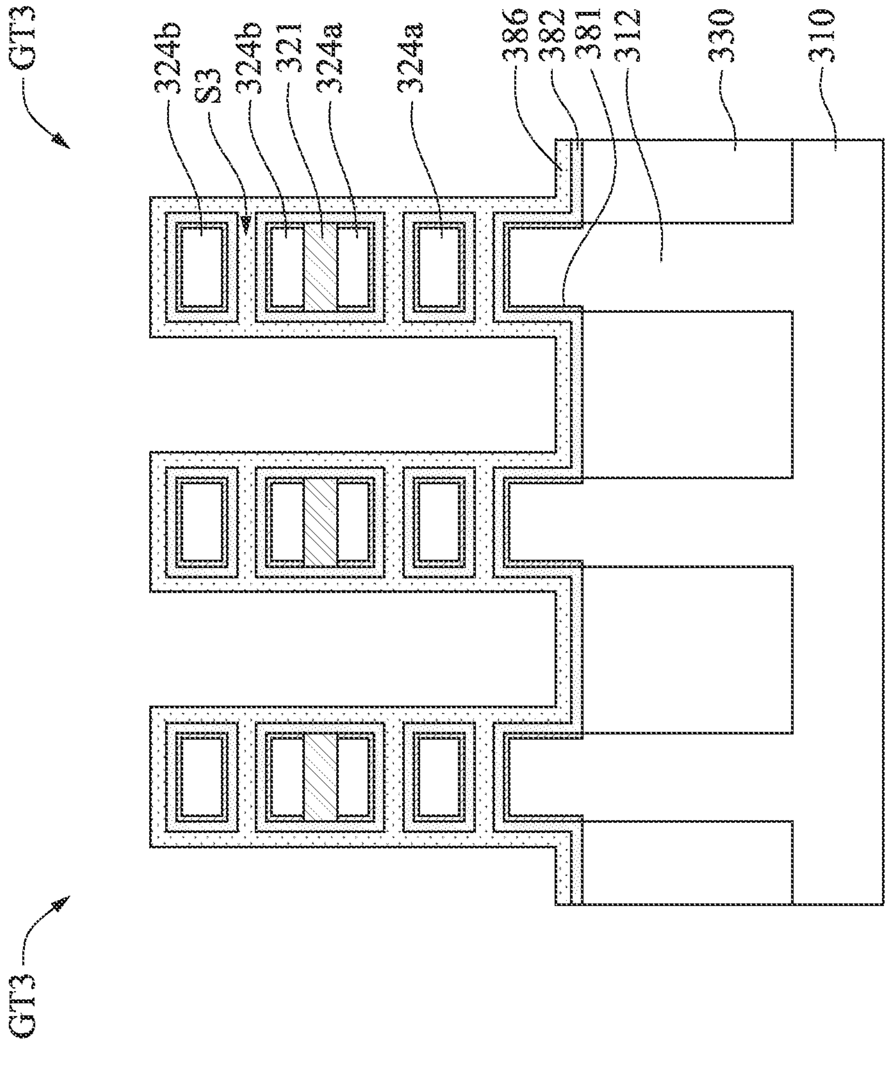
FIGS. 17-21C illustrate schematic views of intermediate stages in the manufacturing of CFETs in accordance with some embodiments.

Reference is made to FIGS. 17-21C. FIGS. 17-21C illustrate cross-sectional views of intermediate stages in the manufacturing of CFETs in accordance with some embodiments. The steps preceding FIG. 17 can correspond to those illustrated in FIGS. 2A-3. In FIG. 17, a substrate 310, a protruding portion 312, an isolation layer 321, epitaxial layers 324*a* and 324*b*, an isolation structure 330, a gate spacer 358, an inner dielectric spacer 359, source/drain epitaxial structures 360 and 365, and isolation structures 370 and 375 can correspond to the substrate 110, the protruding portion 112, the isolation layer 121, the epitaxial layers 124*a* and 124*b*, the isolation structure 130, the gate spacer 158, the inner dielectric spacer 159, the source/drain epitaxial structures 160 and 165, and the isolation structures 170 and 175 in FIGS. 2A-3.

Figure 19:
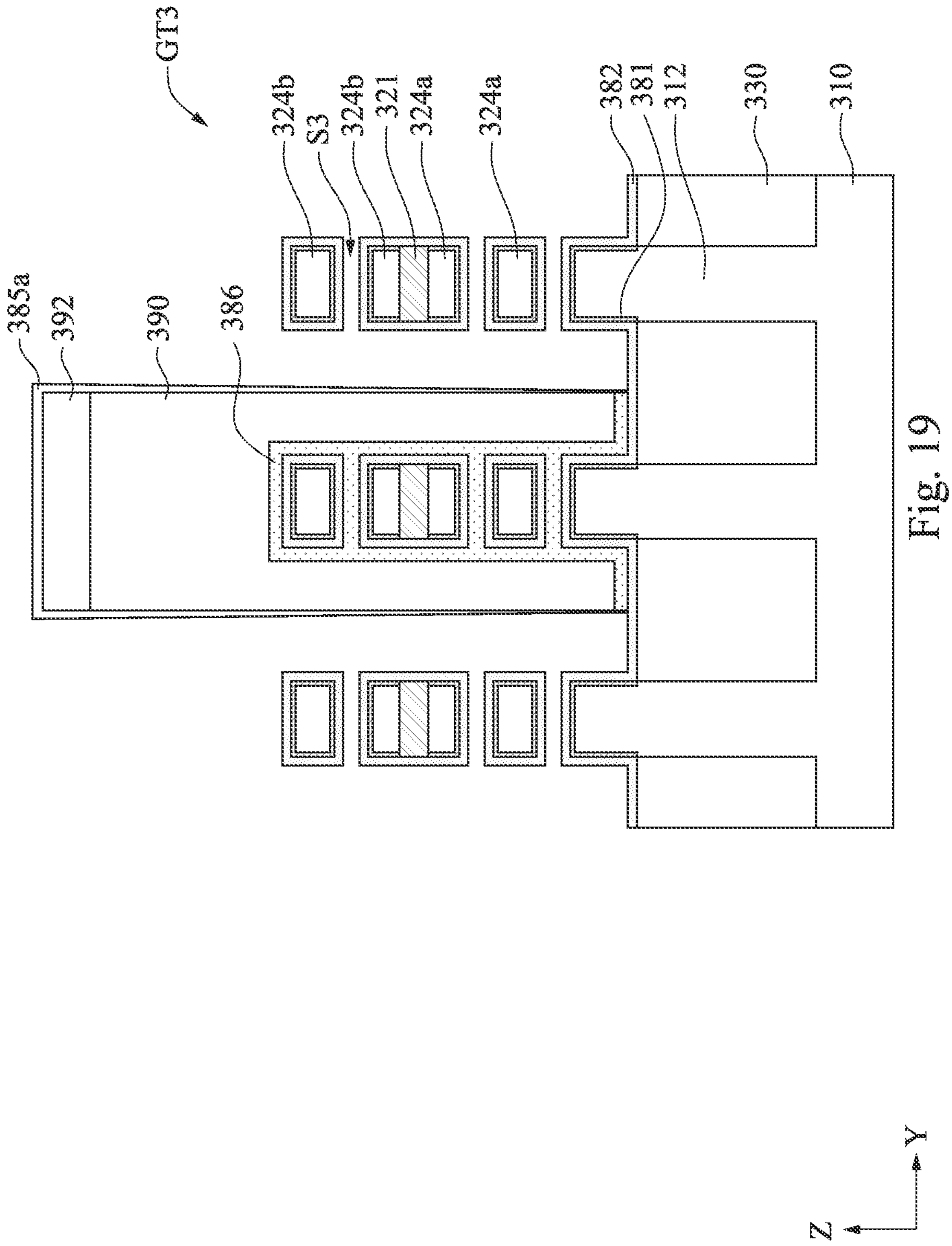
Figure 20:
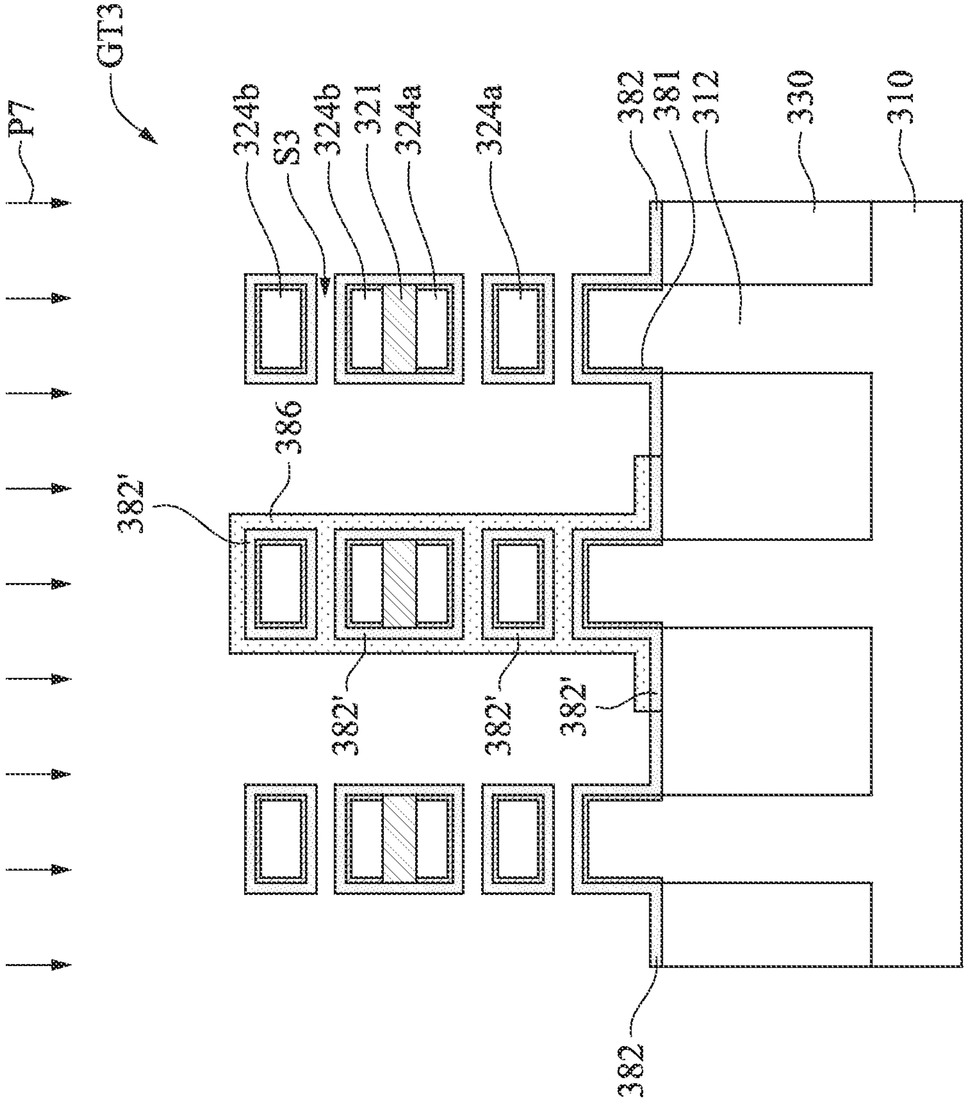
Figure 21A:
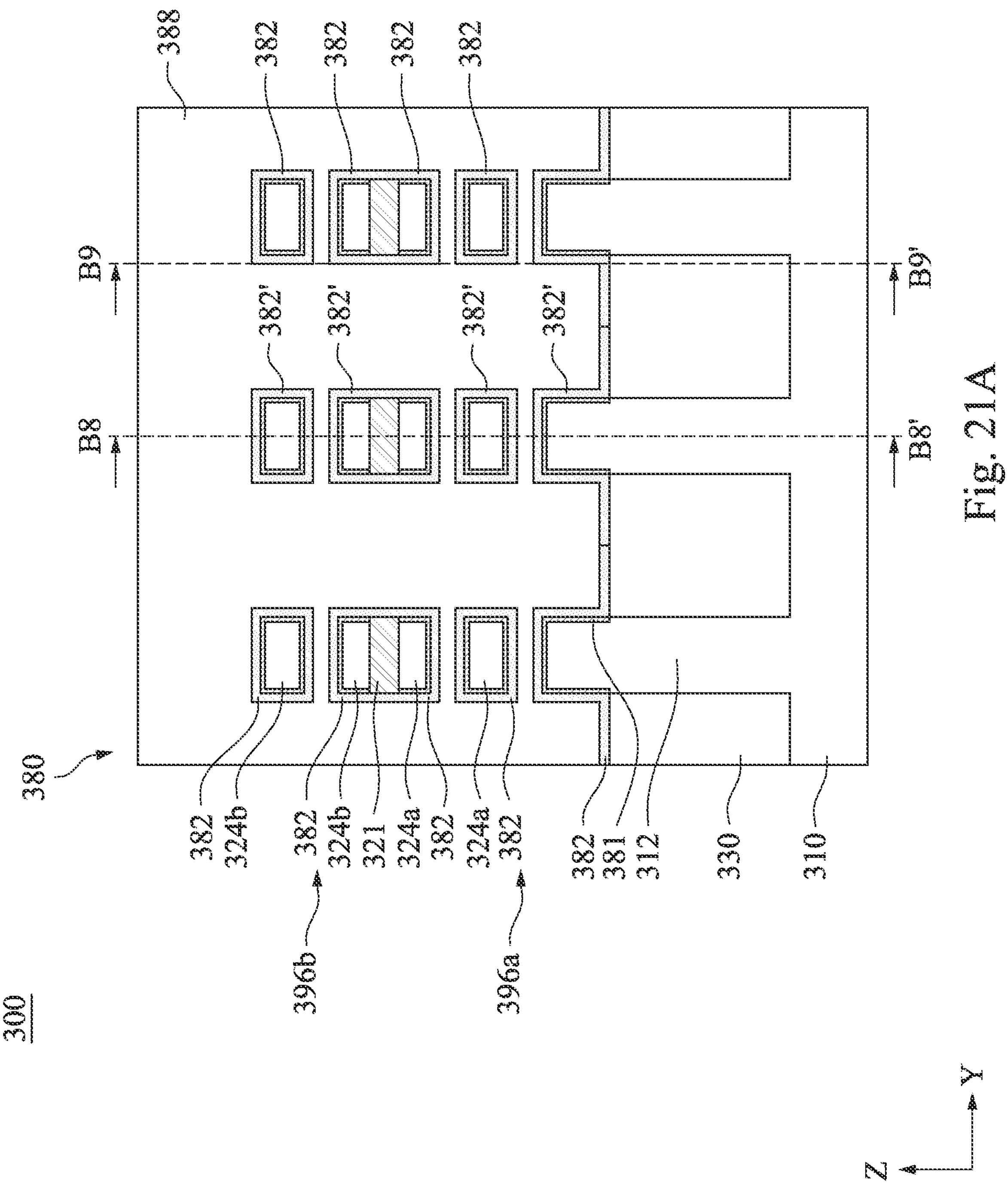
Figure 21B:
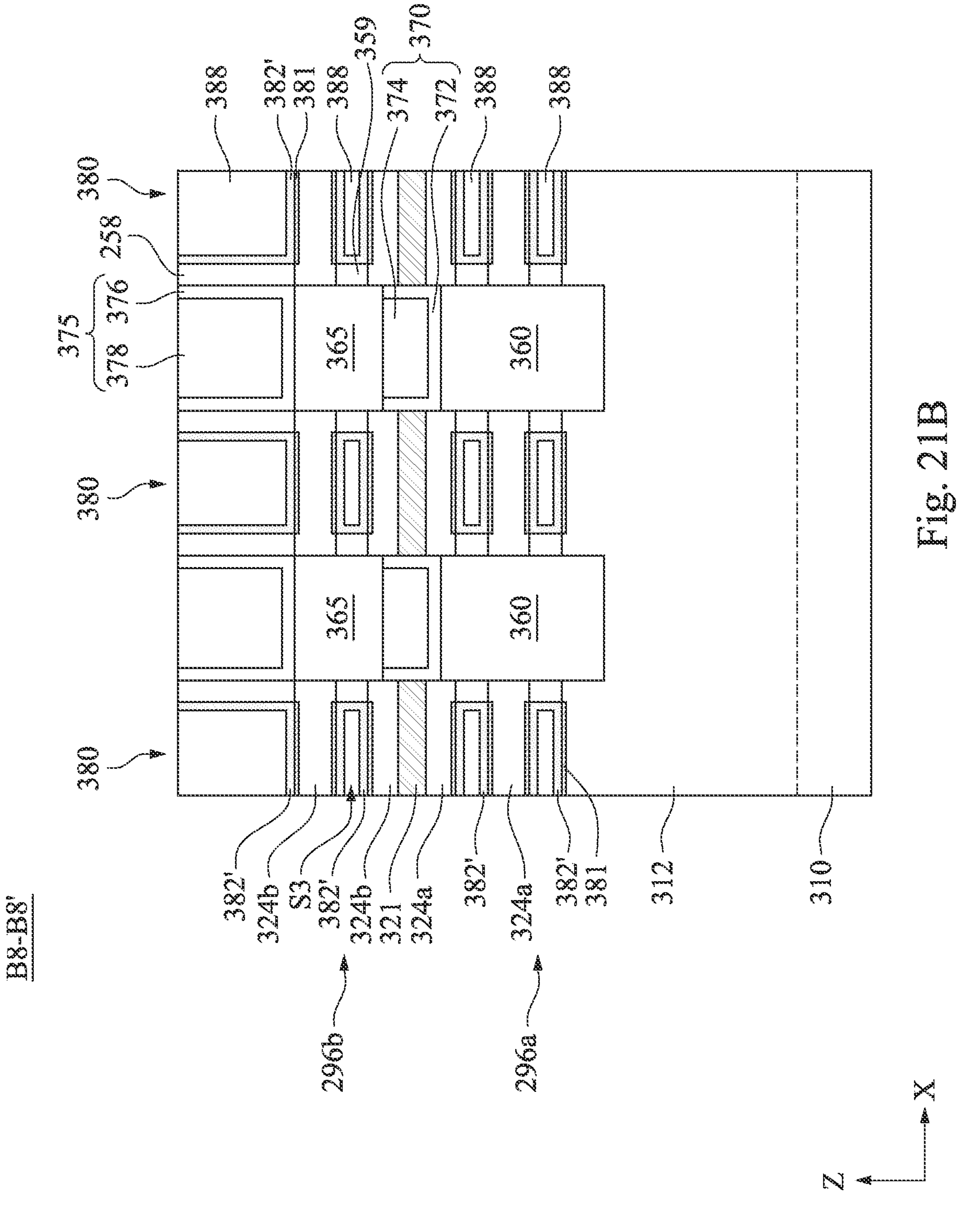
Figure 21C:
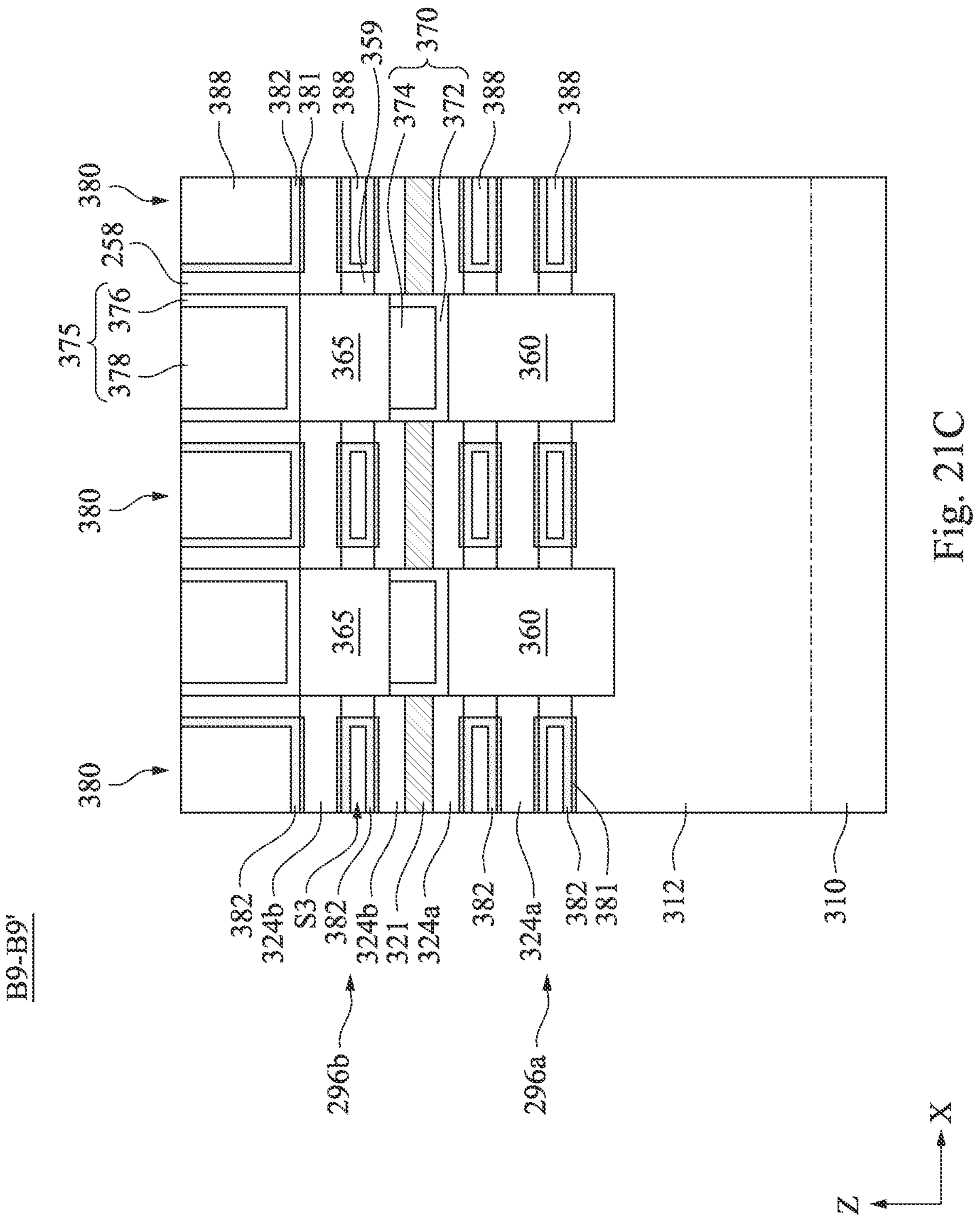

FIGS. 17, 18, 19, 20, 21A illustrate cross-sectional views along a similar cross-section as reference cross-section A-A' in FIG. 1. FIG. 21B illustrates a cross-sectional views taken along line B8-B8' as shown in FIG. 21A. FIG. 21C illustrates a cross-sectional views taken along line B9-B9' as shown in FIG. 21A.

Reference is made to FIG. 17. An interfacial layer 381 is formed around the epitaxial layers 324*a* and 324*b*, and a high-k dielectric layer 382 is formed over the interfacial layer 381. Subsequently, a dipole layer 386 is conformally formed over the high-k dielectric layer 382 and fills into the spaces S3 between neighboring epitaxial layers 324*a* and 324*b*. In some embodiments, the interfacial layer 381, the high-k dielectric layer 382, and the dipole layer 386 can correspond to the interfacial layer 181, the high-k dielectric layer 182, and the dipole layer 186 in FIGS. 4 and 7.

Figure 18:
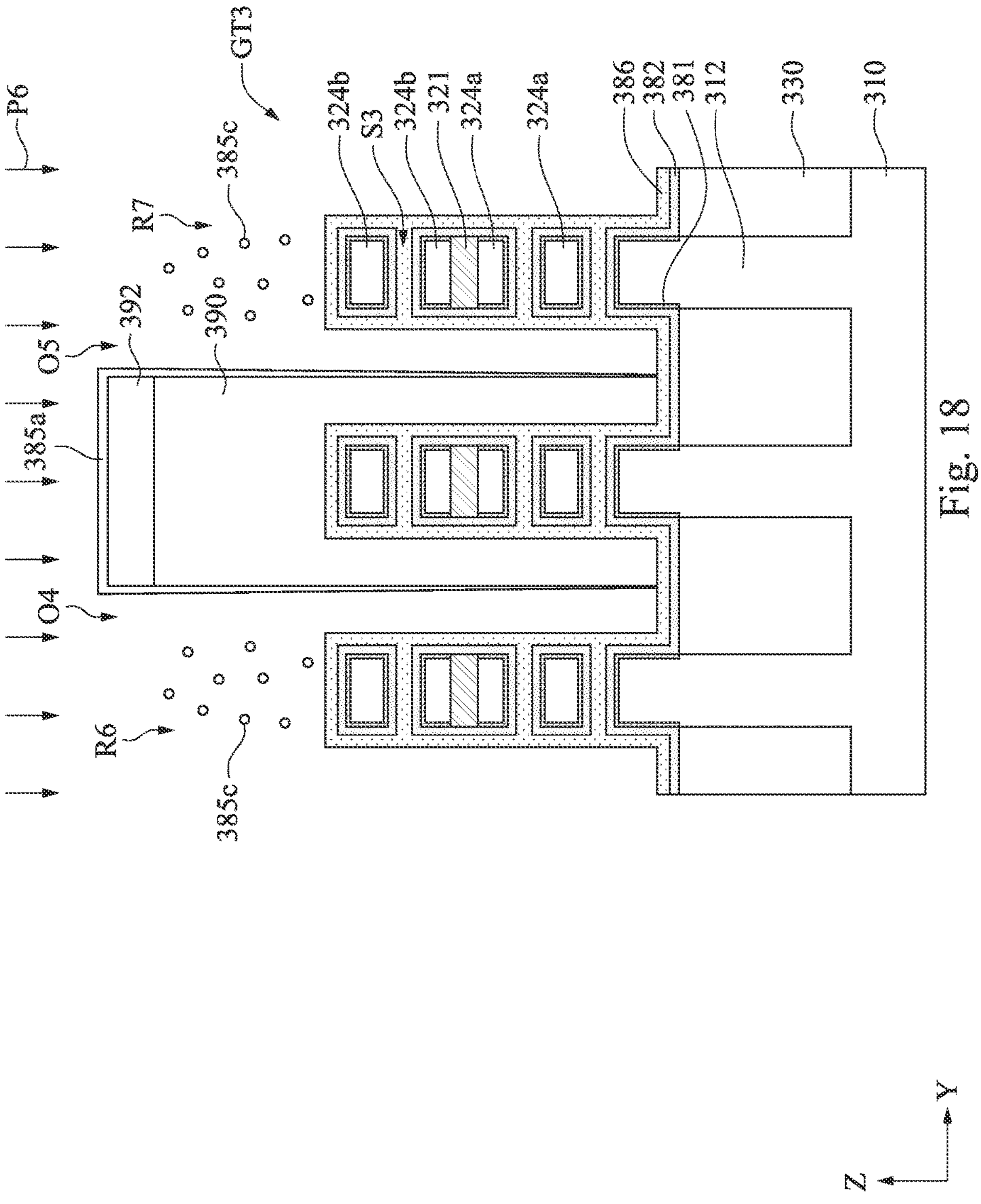

Reference is made to FIG. 18. A dummy material 390 is deposited over the substrate 310 and fills in the gate trench GT3. A patterned mask layer 392 having openings O4 and O5 is formed over the dummy material 390 to expose the dipole layer 386 to be patterned underlying the dummy material 390. In some embodiments, the dummy material 390 and the mask layer 392 can correspond to the dummy material 190 and the mask layer 192 in FIG. 4.

An etching back process P6 is performed on the dummy material 390 to create recesses R6 and R7. This etching back process P6 is performed to expose the dipole layer 386 that overlays the epitaxial layers 324*a* and 324*b*. Once exposed, this dipole layer 386 is then removed (see FIG. 19), revealing the high-k dielectric layer 382 situated over the epitaxial layers 324*a* and 324*b*.

In some embodiments, the etching back process P6 can correspond to the etching back process P1 and can refer to the previous figures and related description. The first phase of the etching back process P6 targets the dummy material 390, etching it downwards. Concurrently, a passivation layer 385*a* can be selectively formed on the sidewalls of the recesses R6 and R7. This passivation layer 385*a* can be act as it prevents the etching back process P6 from inadvertently etching into the structures lying beneath the patterned hard mask layer 392. The formation of the passivation layer 385*a* can involve introducing a precursor 385*c* during the etching back process P6. In some embodiment, the precursor 385*e* can correspond to the previous precursor 185*c*. The second phase of etching back process P6 can involve the removal of remaining dummy material 390 that present on the dipole layer 386. The removal of this residual dummy material 390 can be as it ensures that the subsequent dipole layer removal process (see FIG. 19) can proceed without obstruction.

As shown in FIG. 19, after the etching back process P6, the exposed dipole layer 386 can be removed by an etching process as illustrated in FIG. 12, and this etching process can refer to the previous figures and related description. Subsequently, the dummy material 390, the mask layer 392, and the passivation layer 385*a* can be removed.

Reference is made to FIG. 20. A drive-in annealing process P7 is performed. In some embodiments, the annealing process P7 can correspond to the drive-in annealing process P2 and can refer to the previous figures and related description. The annealing results in the dipole dopant to be driven into high-k dielectric layer 382. The high-k dielectric layer 382 doped with the dipole dopant and can be referred to as (dipole-dopant containing) high-k dielectric layer 382'. The high-k dielectric layer 382' can be in bottom-tier and top-tier transistors 396*a* and 396*b* (see FIG. 21A) of the CFET. After the drive-in annealing process P7, the exposed dipole layer 386 can be removed by an etching process as illustrated in FIG. 12, and this etching process can refer to the previous figures and related description.

Reference is made to FIGS. 21A-21C. A metal gate electrode 388 is deposited over the high-k dielectric layers 382 and 382' and fills in the gate trenches GT3 and the spaces S3. In some embodiments, the metal gate electrode 388 can correspond to the metal gate electrode 188 as shown in FIGS. 8A and 8B. As such, gate structures 380 can be formed. The gate structure 380 can include the interfacial layer 381, the high-k dielectric layer 382/382', and the metal gate electrode 388. Therefore, the semiconductor device 300 can be formed to include a bottom-tier transistor 396*a* and a top-tier transistor 396*b* over the bottom-tier transistor 396*a*.

Figure 22:
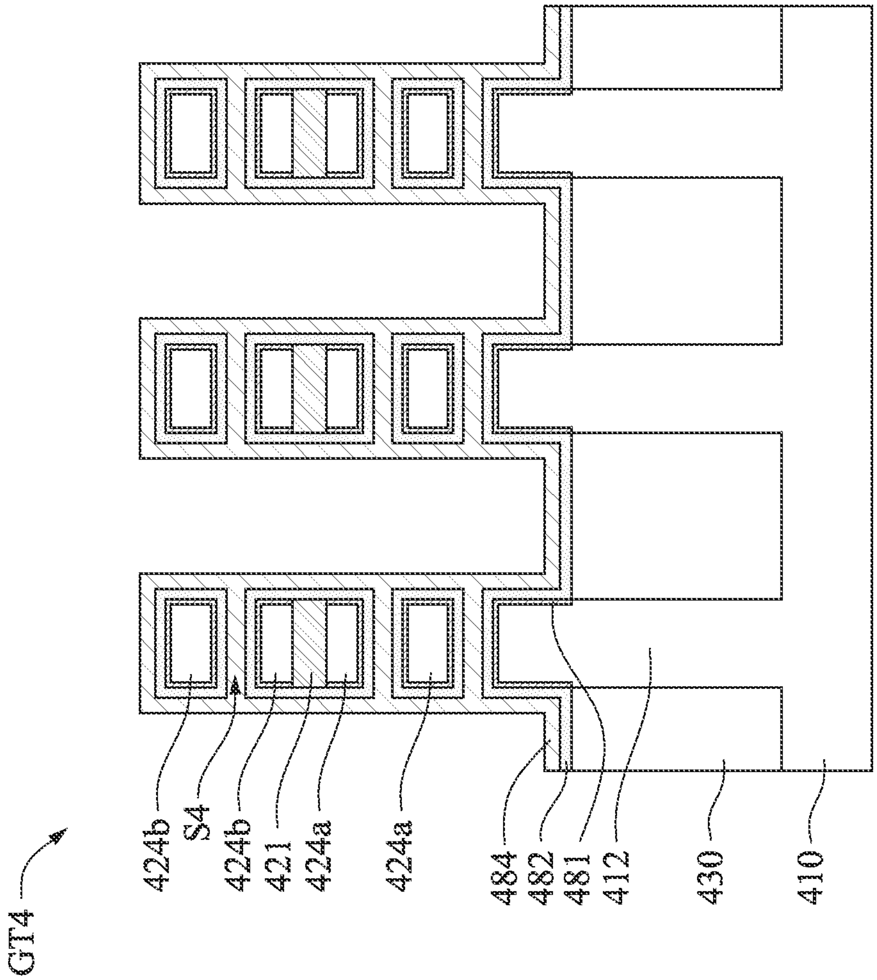
FIGS. 22-33C illustrate schematic views of intermediate stages in the manufacturing of CFETs in accordance with some embodiments.

Reference is made to FIGS. 22-33C. FIGS. 22-33C illustrate cross-sectional views of intermediate stages in the manufacturing of CFETs in accordance with some embodiments. The steps preceding FIG. 22 can correspond to those illustrated in FIGS. 2A-3. In FIG. 22, a substrate 410, a protruding portion 412, an isolation layer 421, epitaxial layers 424*a* and 424*b*, an isolation structure 430, a gate spacer 458, an inner dielectric spacer 459, source/drain epitaxial structures 460 and 465, and isolation structures 470 and 475 can correspond to the substrate 110, the protruding portion 112, the isolation layer 121, the epitaxial layers 124*a* and 124*b*, the isolation structure 130, the gate spacer 158, the inner dielectric spacer 159, the source/drain epitaxial structures 160 and 165, and the isolation structures 170 and 175 in FIGS. 2A-3.

Figure 31:
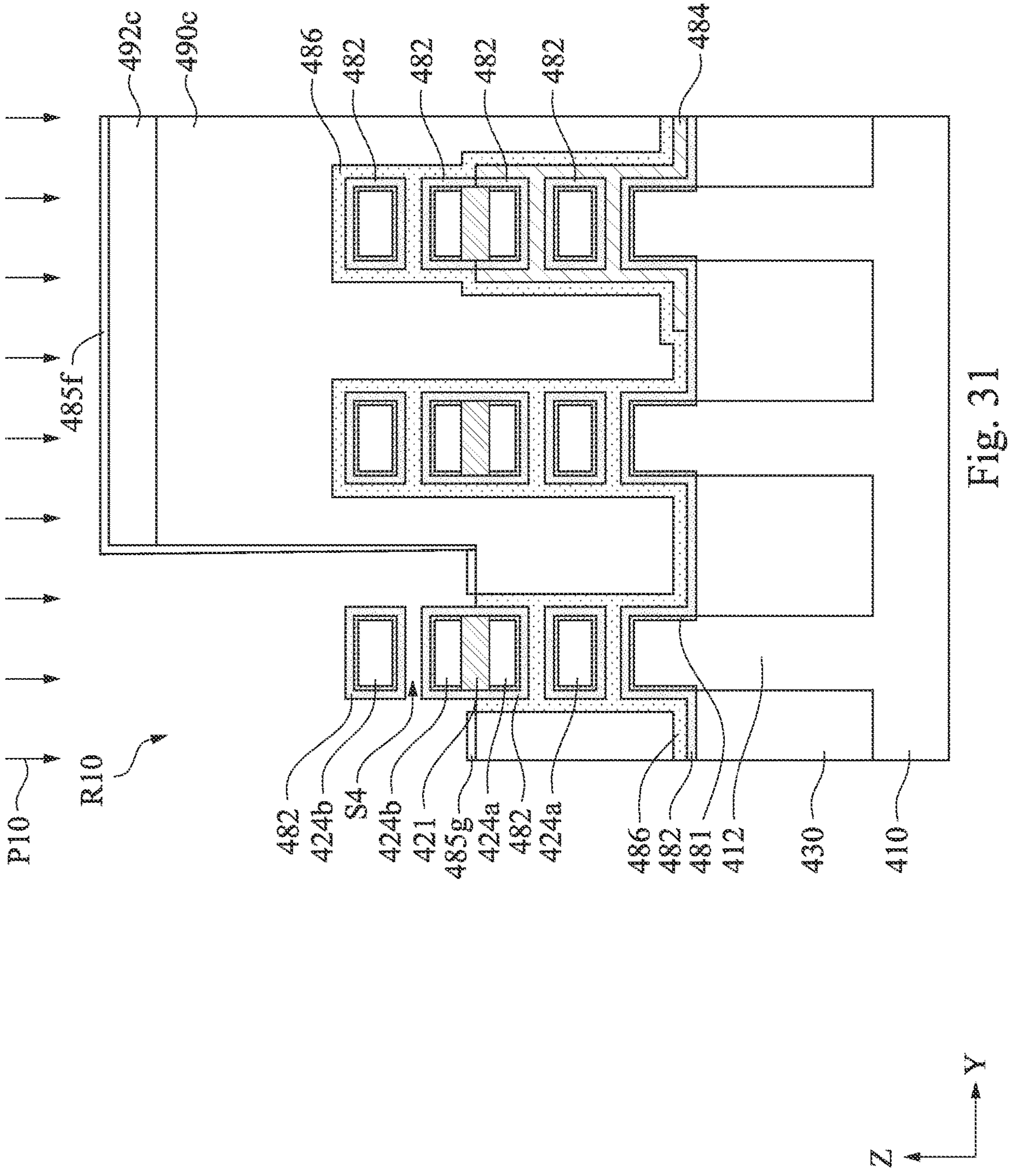
Figure 32:
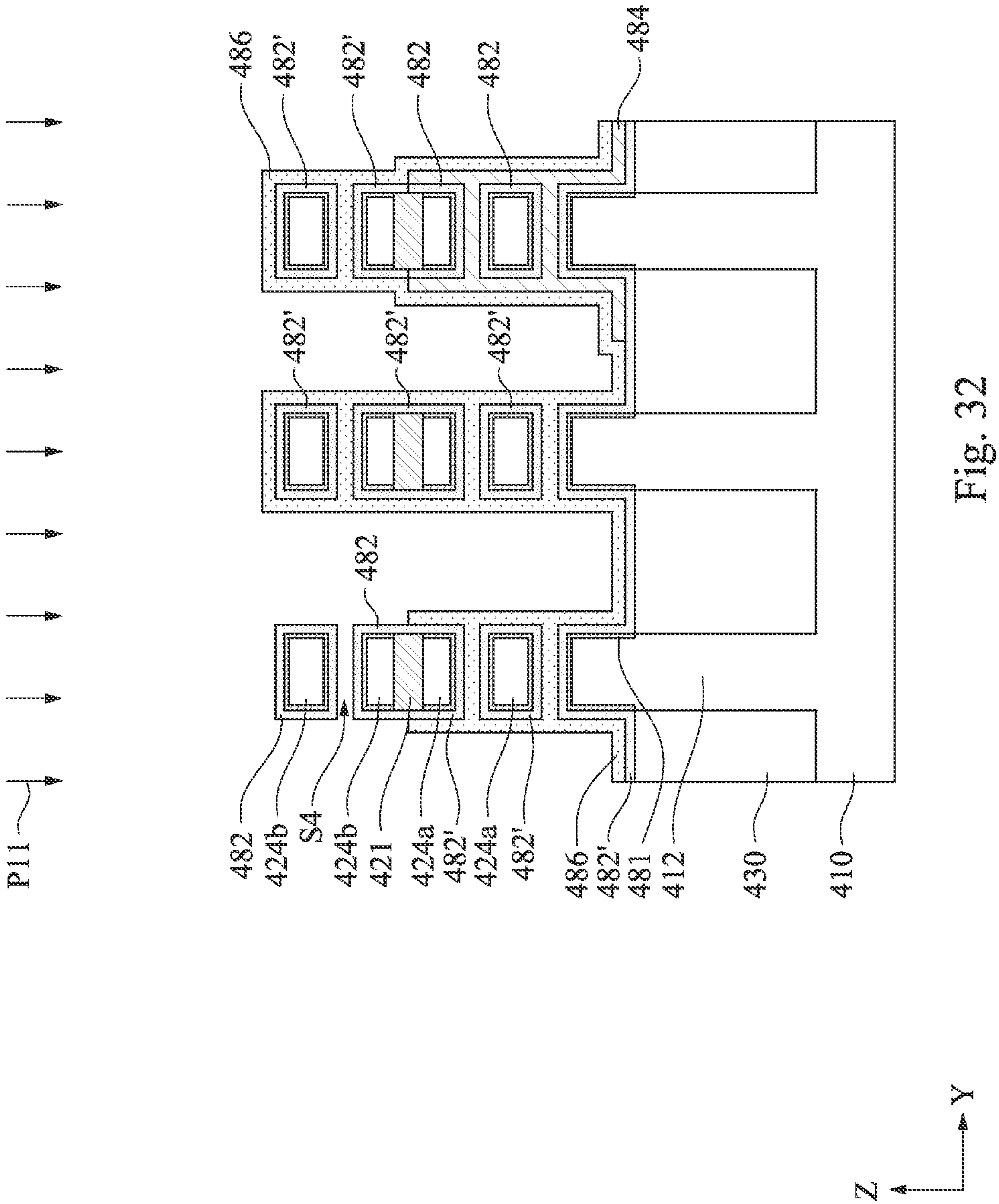
Figure 33A:
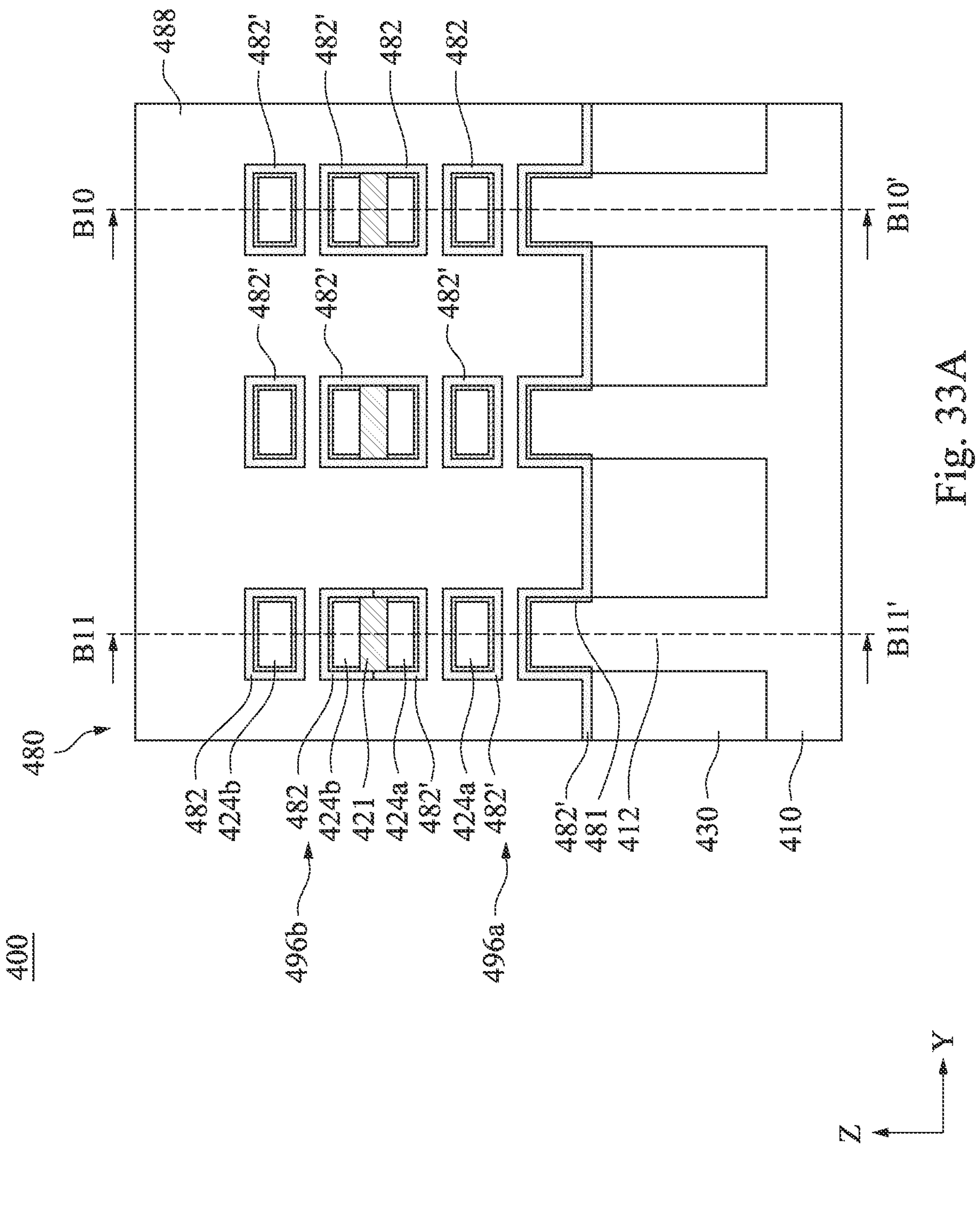
Figure 33B:
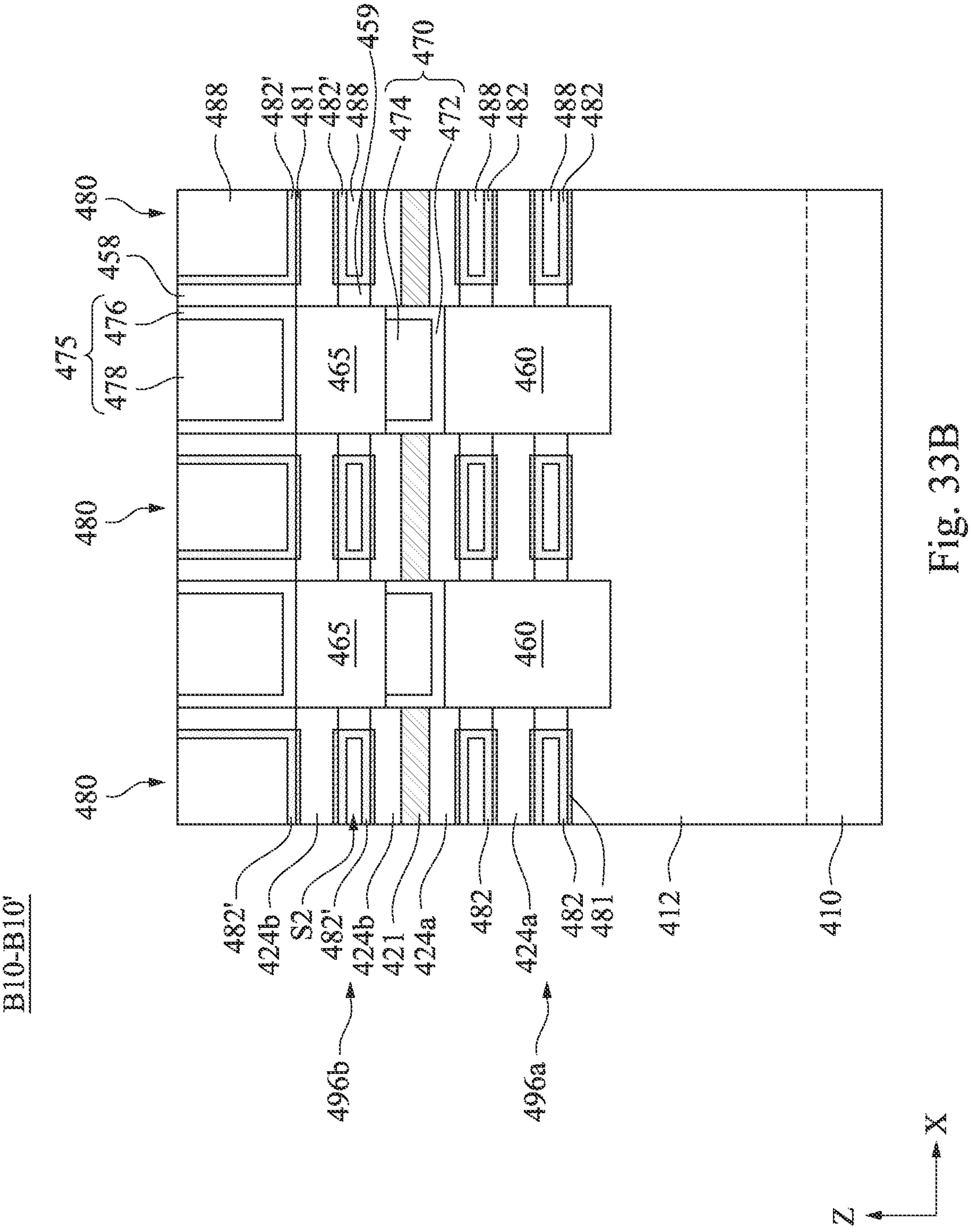
Figure 33C:
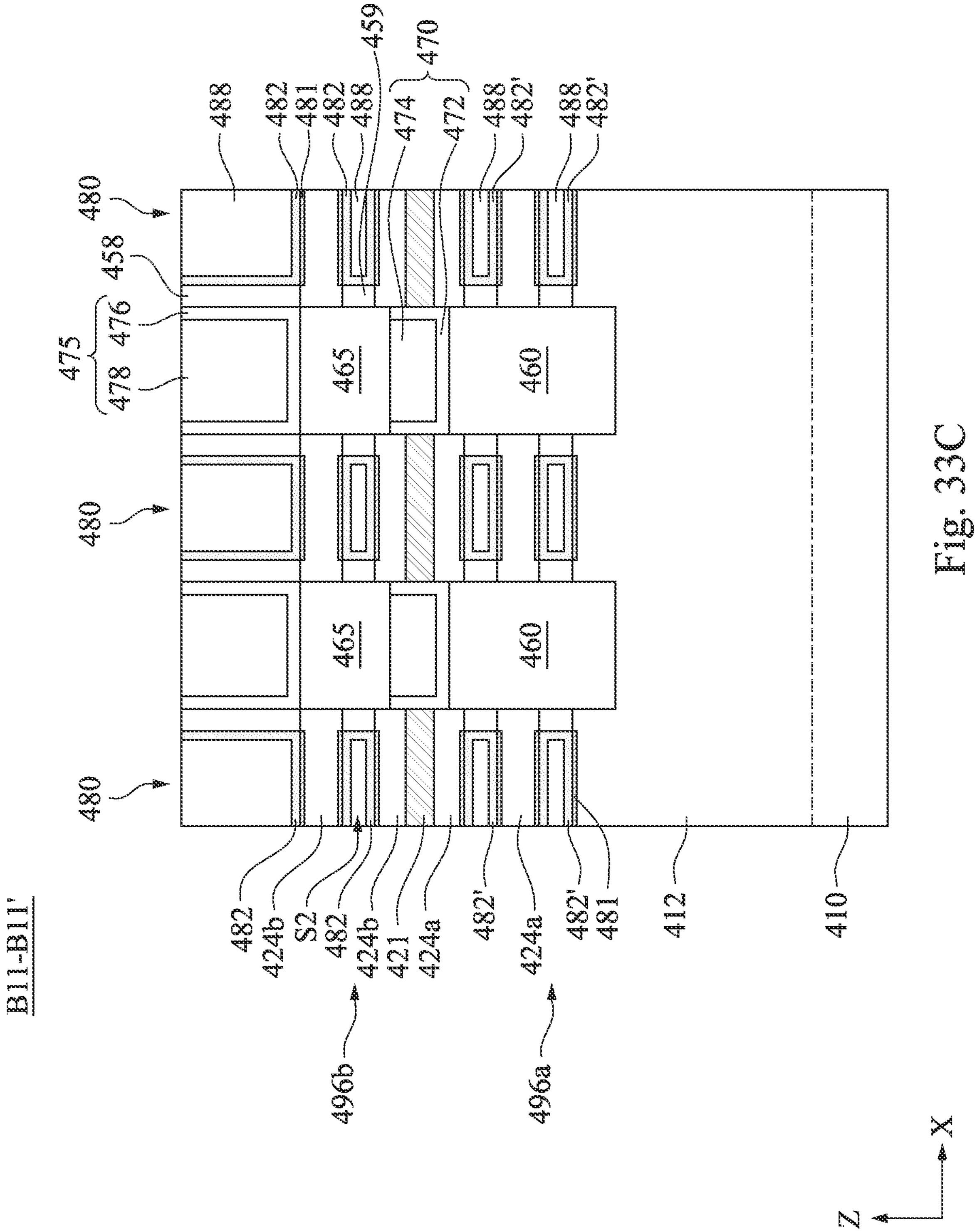

FIGS. 22, 23, 24, 25, 26, 27, 28, 29, 30, 31, 32, and 33A illustrate cross-sectional views along a similar cross-section as reference cross-section A-A' in FIG. 1. FIG. 33B illustrates a cross-sectional views taken along line B10-B10' as shown in FIG. 33A. FIG. 33C illustrates a cross-sectional views taken along line B11-B11' as shown in FIG. 33A.

Reference is made to FIG. 22. An interfacial layer 481 is formed around the epitaxial layers 424*a* and 424*b*, and a high-k dielectric layer 482 is formed over the interfacial layer 481. Subsequently, a barrier layer 484 is conformally formed over the high-k dielectric layer 482 and fills into the spaces S4 between neighboring epitaxial layers 424*a* and 424*b*. In some embodiments, the interfacial layer 481, the high-k dielectric layer 482, and the barrier layer 484 can correspond to the interfacial layer 181, the high-k dielectric layer 182, and the barrier layer 184 in FIG. 4.

Figure 23:
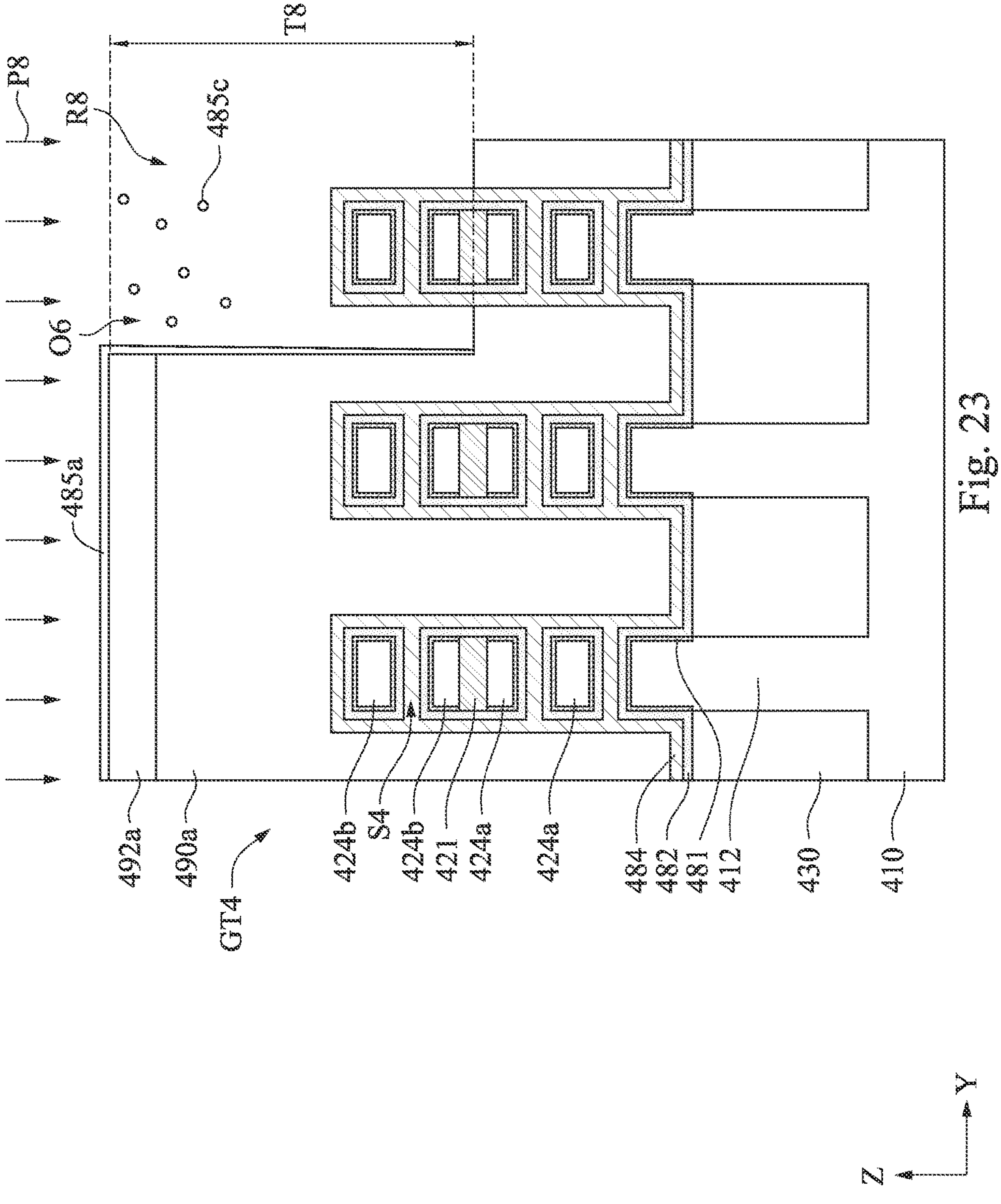

Reference is made to FIG. 23. A dummy material 490*a* is deposited over the substrate 410 and fills in the gate trench GT4. A patterned mask layer 492*a* having an opening O6 is formed over the dummy material 490*a* to expose the barrier layer 484 to be patterned underlying the dummy material 490*a*. In some embodiments, the dummy material 490*a* and the mask layer 492*a* can correspond to the dummy material 190 and the mask layer 192 in FIG. 4.

Figure 24:
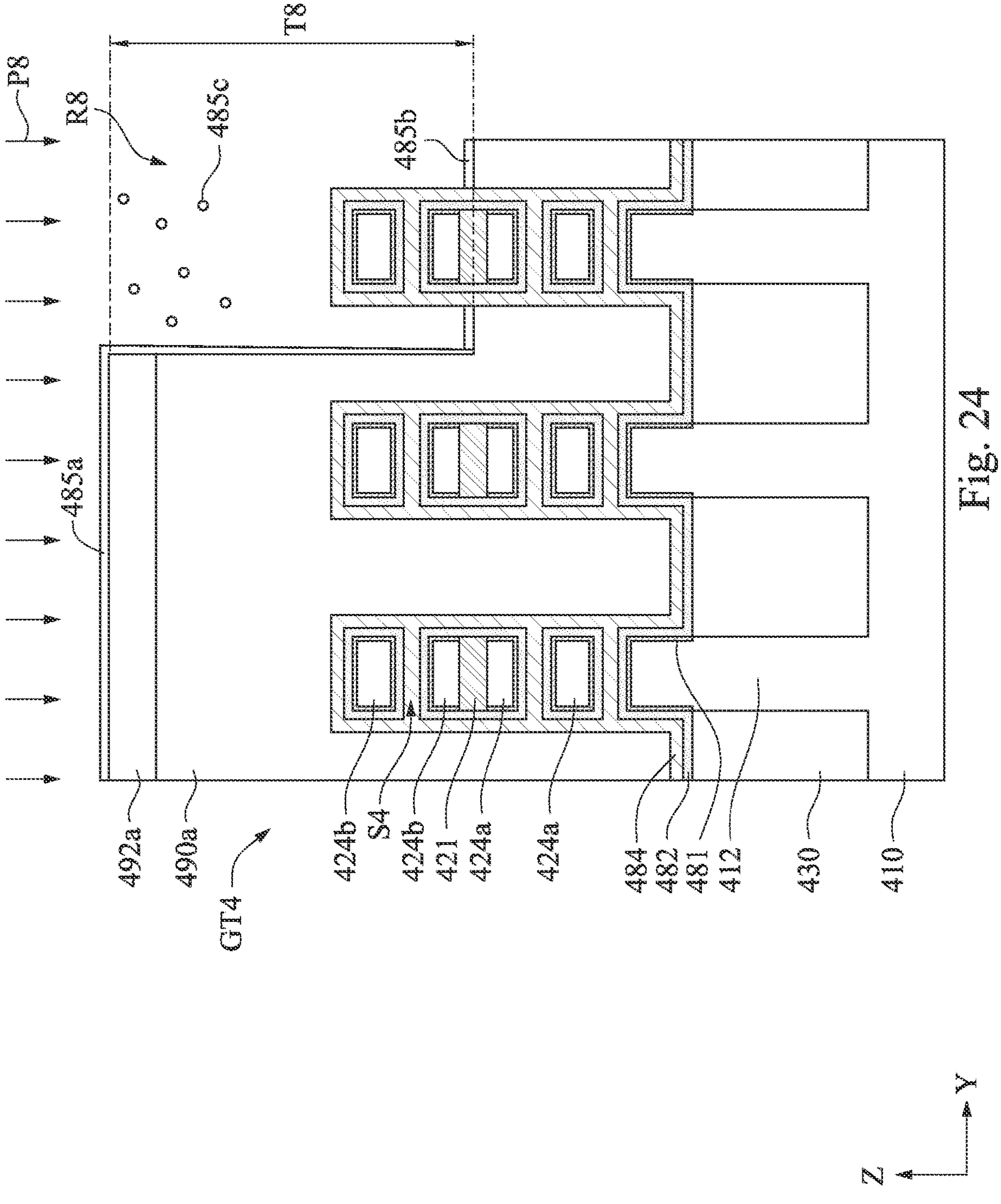

Reference is made to FIGS. 23 and 24. FIGS. 23 and 24 illustrate a stage where an etching back process P8 is performed on the dummy material 490*a* to create a recess R8 to expose the barrier layer 484 The etching back process P8 can be executed in two distinct phases similar to the etching back process P1 (see FIGS. 4-5B). That is, the etching back process P8 can correspond to the etching back process P1 and can refer to the previous figures and related description. Specifically, the first phase of the etching back process P8 can be shown in FIG. 23. During this phase, the etching back process P8 targets the dummy material 490*a*, etching it downwards. Concurrently, a passivation layer 485*a* (see FIG. 23) can be selectively formed on the sidewall of the recess R8. This passivation layer 485*a* can be act as it prevents the etching back process P8 from inadvertently etching into the structures lying beneath the patterned hard mask layer 492*a*. The formation of the passivation layer 485*a* can involve introducing a precursor 485*c* (see FIG. 23) during the etching back process P8. The precursor 485*c* can be less to (or does not) deposit or adhere to the barrier layer

484. In some embodiment, the precursor 485*c* can correspond to the previous precursor 185*c*.

The second phase of etching back process P8 can be shown in FIG. 24. In this subsequent phase, the etching back process P8 continues, but now with an additional focus on forming another passivation layer 485*b* at the bottom of the recess R8. This passivation layer 485*b* can act as a stop layer, halting the downward etching of the dummy material 490*a*. Simultaneously, this stage also involves the removal of remaining dummy material 490*a* that present on the barrier layer 484. The removal of this residual dummy material 490*a* can be as it ensures that the subsequent barrier layer 484 removal process (see FIG. 25) can proceed without obstruction. In some embodiments, the recess R8 may have a depth T8 measured form a top surface of the mask layer 492*a* to the bottom of the recess R8 as the depth T2 shown in FIG. 4.

Figure 25:
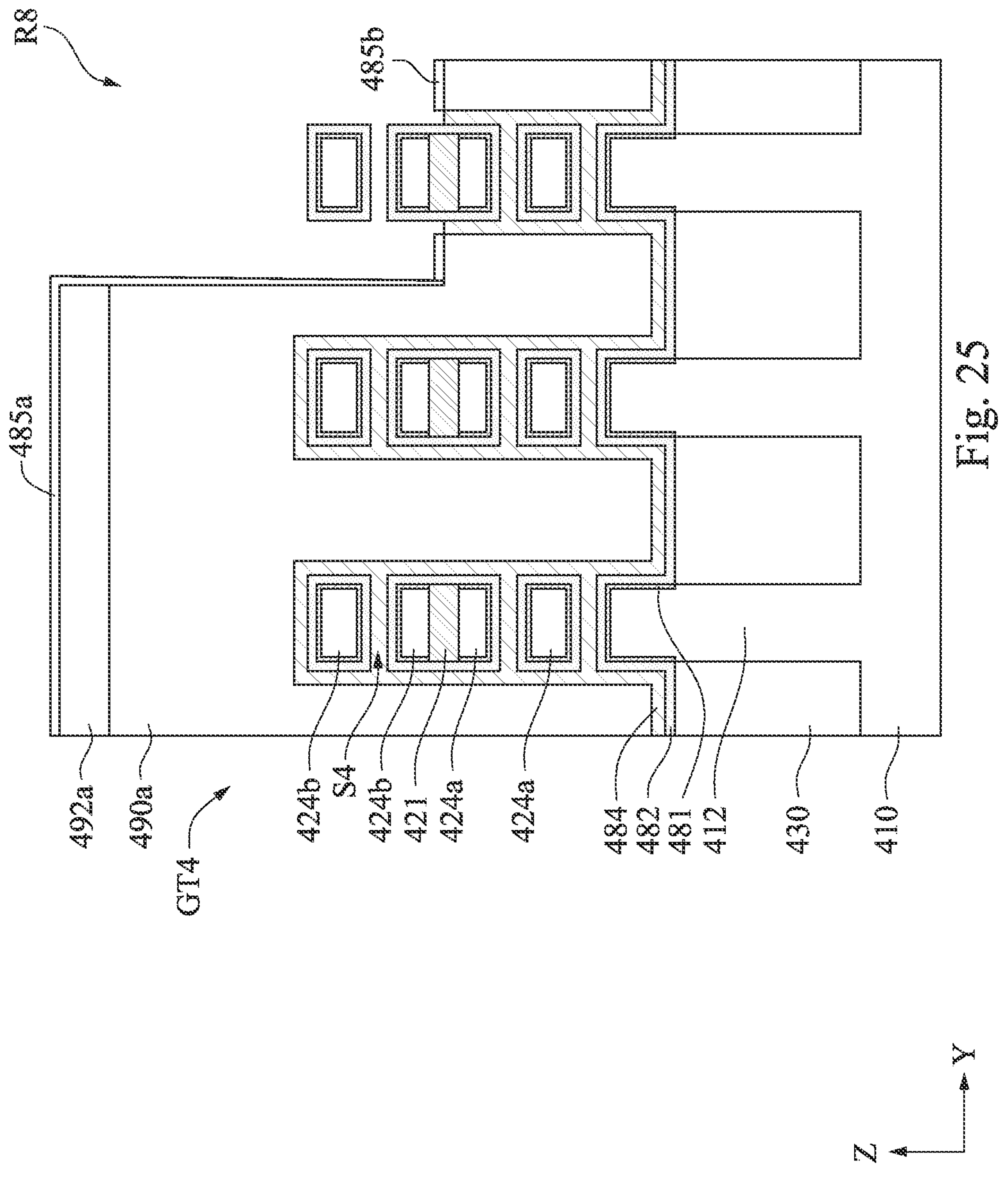

As shown in FIG. 25, after the etching back process P8, the exposed barrier layer 484 can be removed by an etching process as illustrated in FIG. 6, and this etching process can refer to the previous figures and related description. Subsequently, the dummy material 490*a*, the mask layer 492*a*, and the passivation layers 485*a* and 485*b* can be removed.

Figure 26:
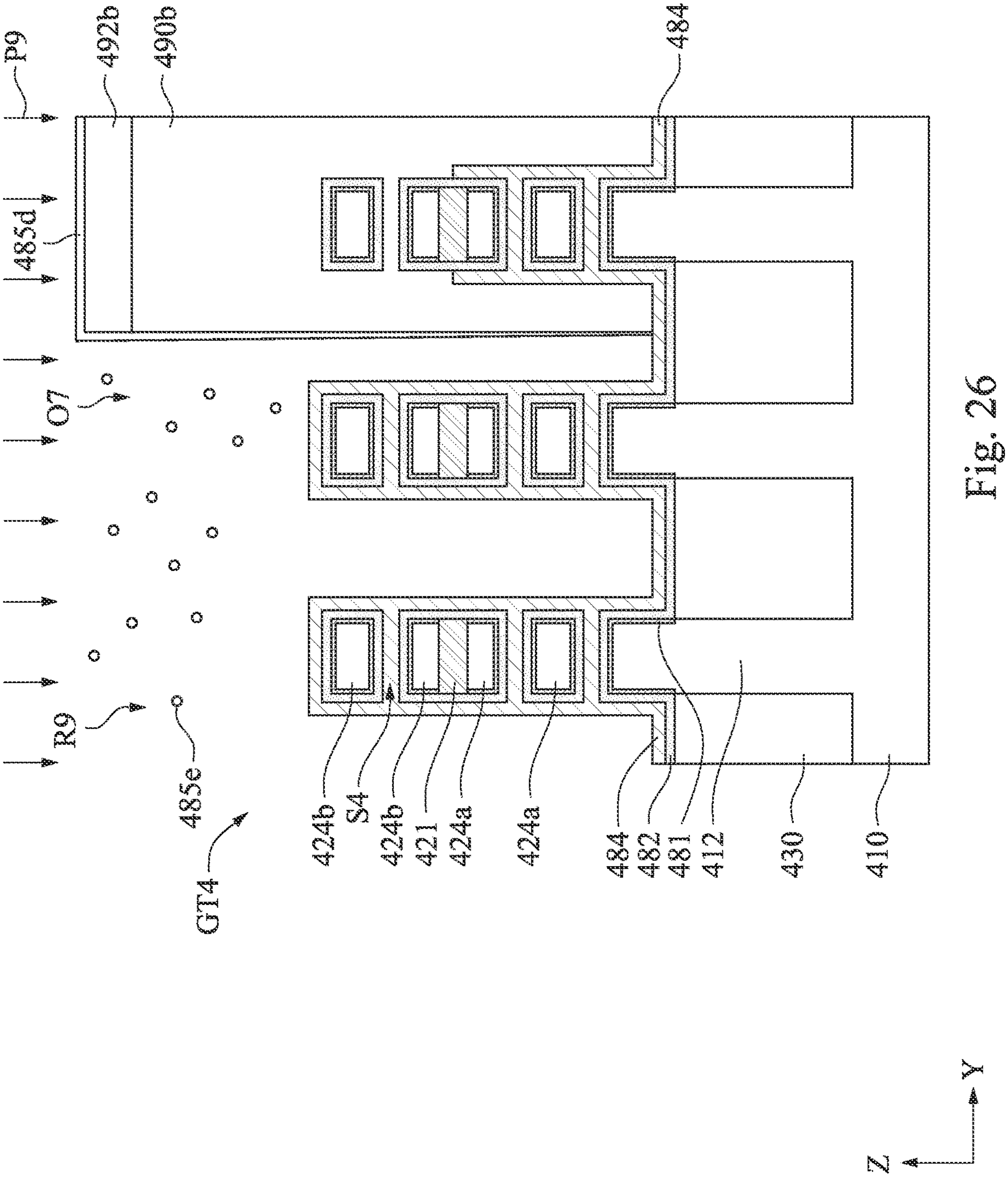

Reference is made to FIG. 26. A dummy material 490*b* is deposited over the substrate 410 and fills in the gate trench GT4. A patterned mask layer 492*b* having an opening (7 is formed over the dummy material 490*b* to expose the barrier layer 484 to be patterned underlying the dummy material 490*b*. In some embodiments, the dummy material 490*b* and the mask layer 492*b* can correspond to the dummy material 190 and the mask layer 192 in FIG. 4.

An etching back process P9 is performed on the dummy material 290*b* to create a recess R9 to expose the barrier layer 484 In some embodiments, the etching back process P9 can correspond to the etching back process P1 and can refer to the previous figures and related description. The first phase of the etching back process P9 targets the dummy material 490*b*, etching it downwards. Concurrently, a passivation layer 485*d* (see FIG. 27) can be selectively formed on the sidewalls of the recess R9. This passivation layer 485*d* can be act as it prevents the etching back process P9 from inadvertently etching into the structures lying beneath the patterned hard mask layer 492*b*. The formation of the passivation layer 485*d* can involve introducing a precursor 485*e* during the etching back process P6. In some embodiment, the precursor 485*e* can correspond to the previous precursor 185*c*. The second phase of etching back process P9 can involve the removal of remaining dummy material 490*b* that present on the barrier layer 484. The removal of this residual dummy material 490*b* can be as it ensures that the subsequent barrier layer removal process (see FIG. 27) can proceed without obstruction.

Figure 27:
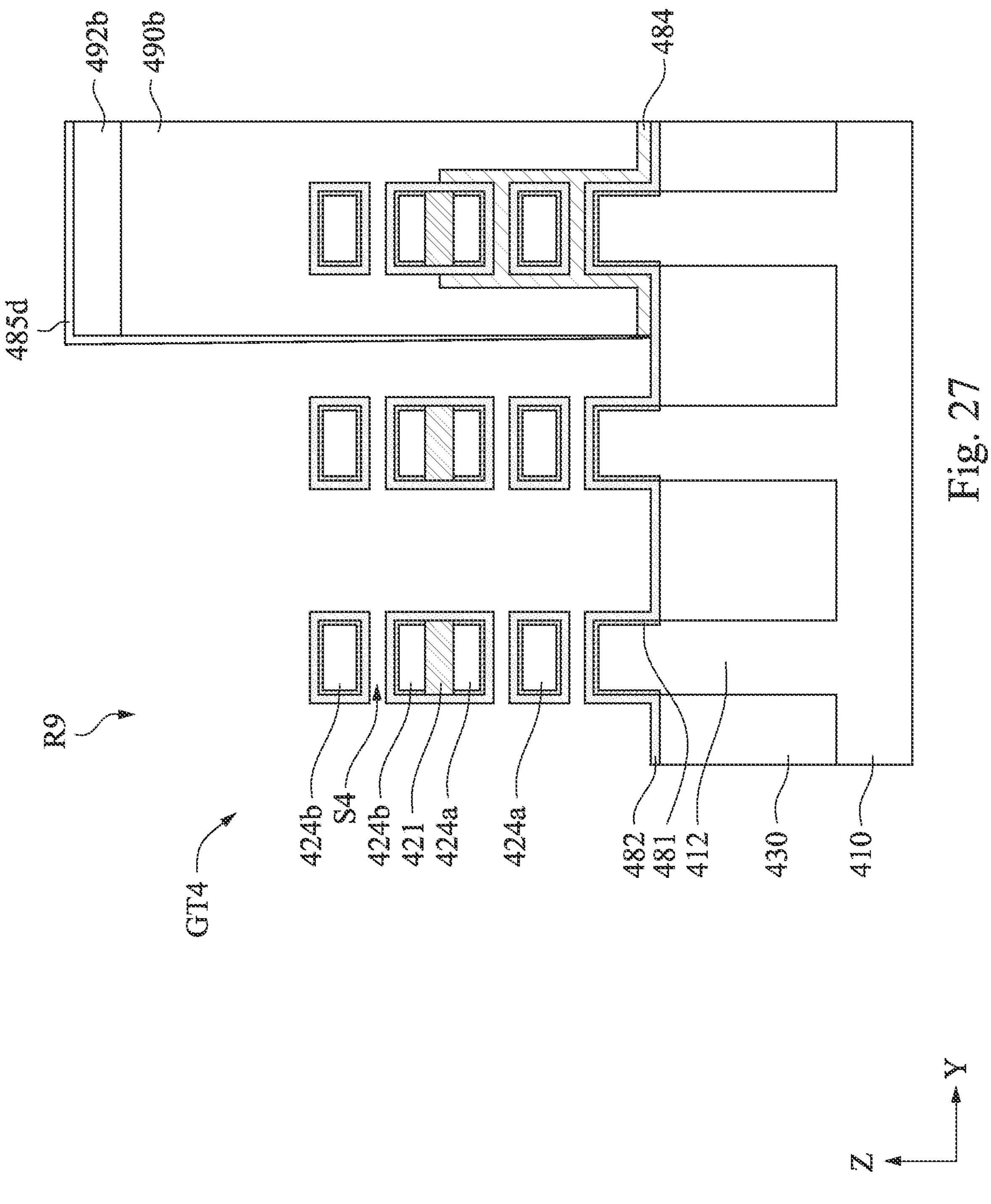

As shown in FIG. 27, after the etching back process P9, the exposed barrier layer 484 can be removed by an etching process as illustrated in FIG. 6, and this etching process can refer to the previous figures and related description. Subsequently, the dummy material 490*b*, the mask layer 492*b*, and the passivation layer 485*d* can be removed.

Figure 28:
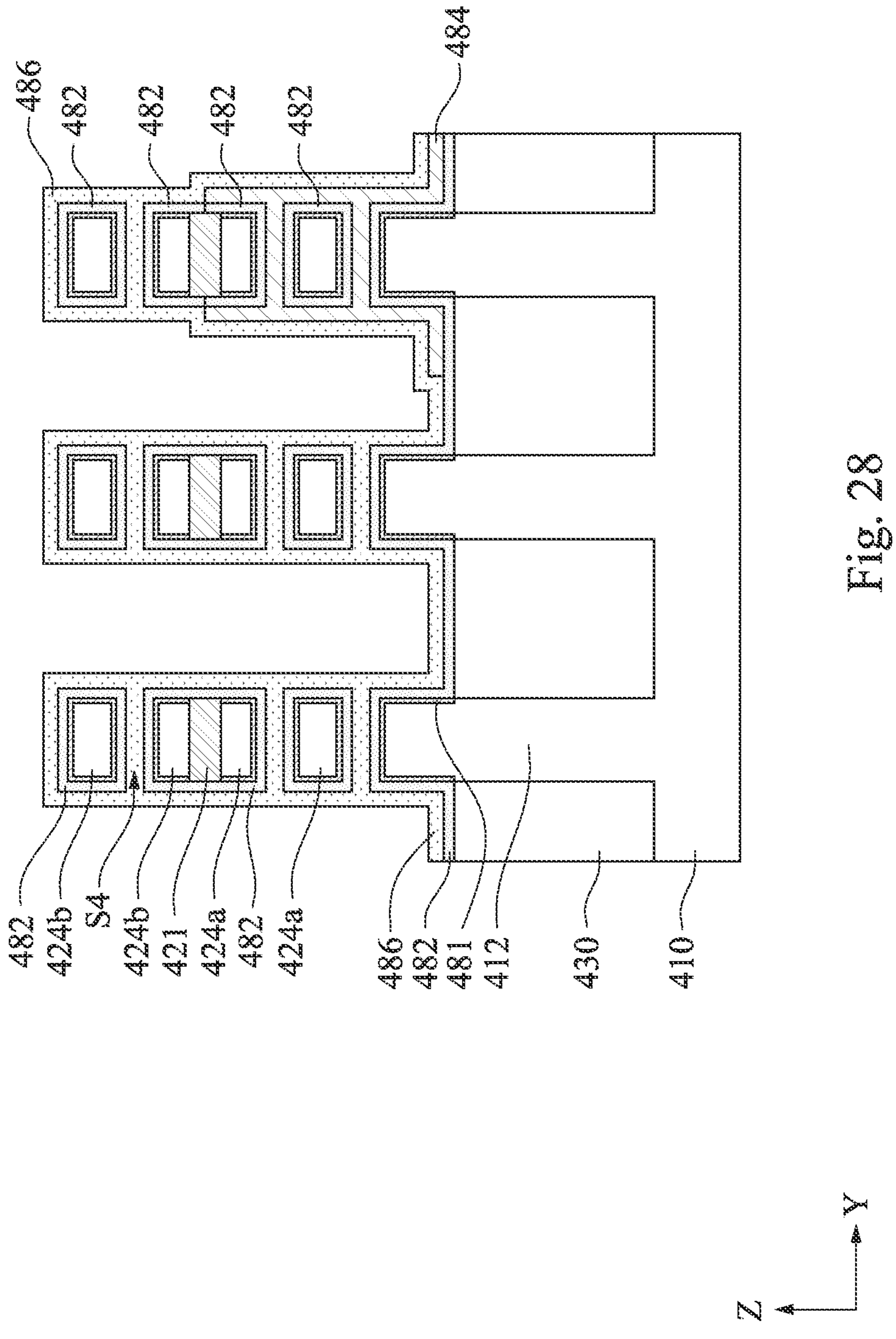

Reference is made to FIG. 28. The dipole layer 486 can be deposited over the substrate 410 in a deposition process. In some embodiments, the dipole layer 486 is substantially similar to that in FIG. 7 in terms of their material and manufacturing methods. That means the dipole layer 486 can correspond to the dipole layer 186 in the previous figures.

Figure 29:
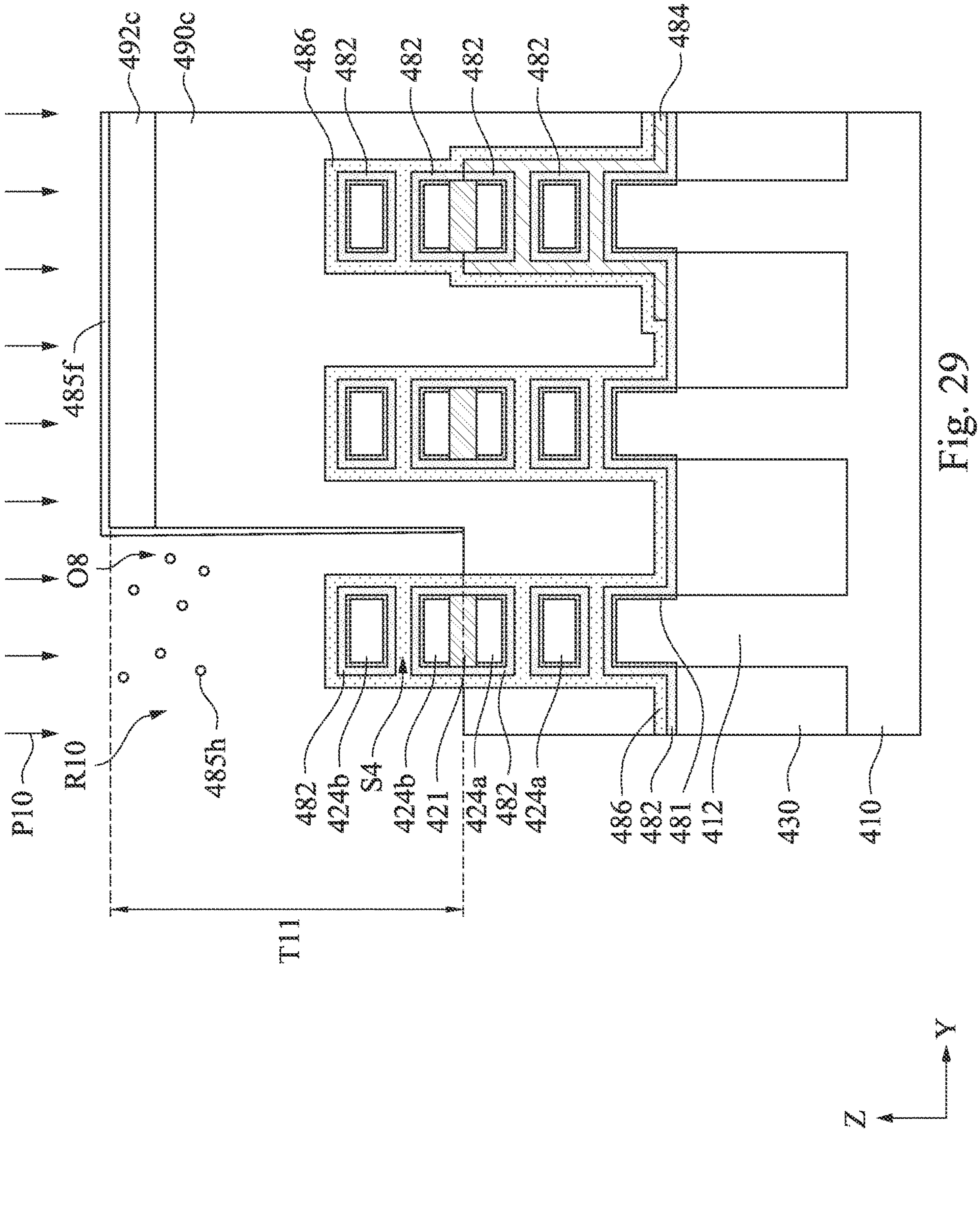

Reference is made to FIG. 29. A dummy material 490*c* is deposited over the substrate 410 and fills in the gate trench GT4. A patterned mask layer 492*c* having an opening O8 is formed over the dummy material 490*c* to expose the dipole layer 486 to be patterned underlying the dummy material 490*c*. In some embodiments, the dummy material 490*c* and the mask layer 492*c* can correspond to the dummy material 190 and the mask layer 192 in FIG. 4.

Figure 30:
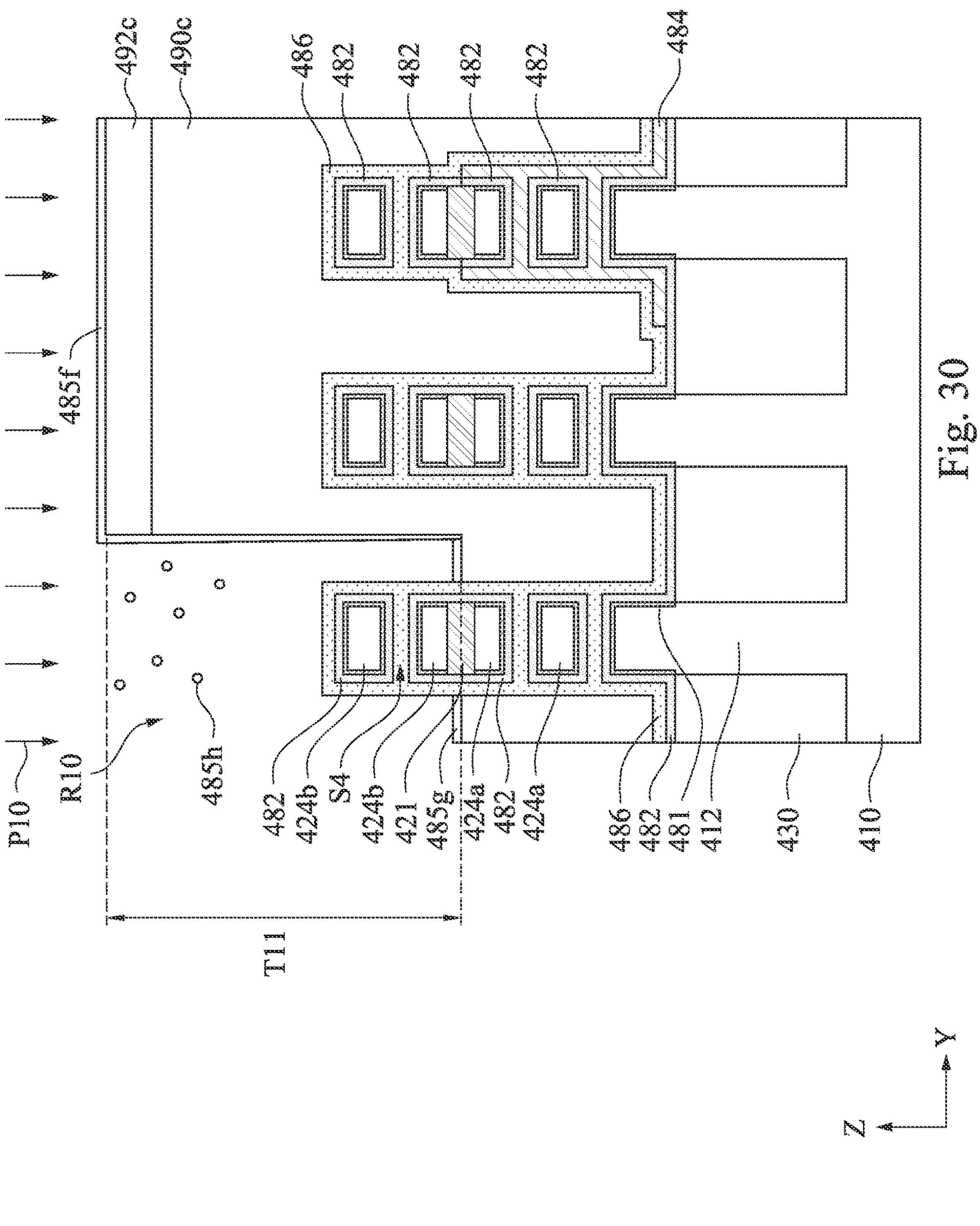

Reference is made to FIGS. 29 and 30. FIGS. 29 and 30 illustrate a stage where an etching back process P10 is performed on the dummy material 490*c* to create a recess R10 to expose the dipole layer 486 The etching back process P10 can be executed in two distinct phases similar to the etching back process P1 (see FIGS. 4-5B). That is, the etching back process P10 can correspond to the etching back process P1 and can refer to the previous figures and related description. Specifically, the first phase of the etching back process P10 can be shown in FIG. 29. During this phase, the etching back process P10 targets the dummy material 490*c*, etching it downwards. Concurrently, a passivation layer 485*f* (see FIG. 29) can be selectively formed on the sidewall of the recess R10. The formation of the passivation layer 485*f* can involve introducing a precursor 485*h* (see FIG. 29) during the etching back process P10. This precursor 485*h* can be less to (or does not) deposit or adhere to the dipole layer 486. In some embodiment, the precursor 485*h* can correspond to the previous precursor 185*c*.

The second phase of etching back process P10 can be shown in FIG. 30. In this subsequent phase, the etching back process P10 continues, but now with an additional focus on forming another passivation layer 485*g* at the bottom of the recess R10. This passivation layer 285*g* can act as a stop layer, halting the downward etching of the dummy material 490*c*. Simultaneously, this stage also involves the removal of remaining dummy material 490*c* that present on the dipole layer 486. The removal of this residual dummy material 490*c* can be as it ensures that the subsequent dipole layer removal process (see FIG. 31) can proceed without obstruction. In some embodiments, the recess R10 may have a depth Tll measured form a top surface of the mask layer 492*c* to the bottom of the recess R10 as the depth T2 shown in FIG. 4.

As shown in FIG. 31, after the etching back process P10, the exposed dipole layer 486 can be removed by an etching process as illustrated in FIG. 12, and this etching process can refer to the previous figures and related description. Subsequently, the dummy material 490*c*, the mask layer 492*c*, and the passivation layer 485*f*, and 485*g* can be removed.

Reference is made to FIG. 32. A drive-in annealing process P11 is performed. In some embodiments, the annealing process P11 can correspond to the drive-in annealing process P2 and can refer to the previous figures and related description. The annealing results in the dipole dopant to be driven into high-k dielectric layer 482. The high-k dielectric layer 382 doped with the dipole dopant and can be referred to as (dipole-dopant containing) high-k dielectric layer 482'. The high-k dielectric layer 482' can be in bottom-tier and top-tier transistors 396*a* and 396*b* (see FIG. 33A) of the CFET. After the drive-in annealing process P11, the exposed dipole layer 486 can be removed by an etching process as illustrated in FIG. 12, the exposed barrier layer 484 can be removed by an etching process as illustrated in FIG. 6, these etching processes can refer to the previous figures and related description.

Reference is made to FIGS. 33A-33C. A metal gate electrode 488 is deposited over the high-k dielectric layers 482 and 482' and fills in the gate trenches GT4 and the spaces S4. In some embodiments, the metal gate electrode 488 can correspond to the metal gate electrode 188 as shown in FIGS. 8A and 8B. As such, gate structures 380 can be formed. The gate structure 480 can include the interfacial layer 481, the high-k dielectric layer 482/482', and the metal gate electrode 488. Therefore, the semiconductor device 400 can be formed to include a bottom-tier transistor 496*a* and a top-tier transistor 496*b* over the bottom-tier transistor 496*a*.

In some embodiments, a method includes forming a first semiconductive nanostructure over a substrate and a second semiconductive nanostructure over the first semiconductive nanostructure; forming first source/drain regions on opposite sides of the first semiconductive nanostructure, and second source/drain regions on opposite sides of the second semiconductive nanostructure; forming a first high-k dielectric layer around the first semiconductive nanostructure, and a second high-k dielectric layer around the second semiconductive nanostructure; forming a barrier layer over the first and second high-k dielectric layers; depositing a dummy material over the barrier layer; performing an etching process on the dummy material to form a recess exposing a first portion of the barrier layer over the second high-k dielectric layer, wherein a second portion of the barrier layer over the first high-k dielectric layer remains covered by the etched dummy material; removing the first portion of the barrier layer to expose the second high-k dielectric layer; removing the dummy material; after removing the dummy material, doping a dipole dopant into the second high-k dielectric layer; forming a gate electrode over the first and second high-k dielectric layers. In some embodiments, the step of etching process comprises introducing a carbon-containing radical on the dummy material. In some embodiments, the dummy material has a carbon atomic concentration greater than about 3%. In some embodiments, the step of performing the etching process comprises: selectively forming a first passivation layer over a sidewall of the recess in the dummy material during forming the recess. In some embodiments, the step of performing the etching process comprises: when the first portion of the barrier layer over the second high-k dielectric layer is exposed, selectively forming a second passivation layer over a bottom of the recess in the dummy material. In some embodiments, the etching process is performed with a bias power, and the bias power after forming the second passivation layer has a lower power level than prior to forming the second passivation layer. In some embodiments, in the etching process, a bias power is periodically switched on and off, and a DC power is periodically switched on and off, wherein the periodical switching of the bias power is synchronized with the periodical switching of the DC power. In some embodiments, the DC power is performed with a pulsing frequency of about 80-120 Hz and a duty cycle set at about 40-60%. In some embodiments, the bias power is performed with a pulsing frequency of about 80-120 Hz and a duty cycle set at about 40-60%. In some embodiments, doping the dipole dopant into the second high-k dielectric layer comprises: forming a dipole layer over and contacting the second high-k dielectric layer; performing an annealing process to drive the dipole dopant from the dipole layer into the second high-k dielectric layer.

In some embodiments, a method includes forming first and second channel layers vertically arranged with respect to each other over a substrate; forming a first gate dielectric layer around the first channel layer, and a second gate dielectric layer around the second channel layer; forming a dipole layer over the first and second gate dielectric layers; forming a carbon-containing material over the dipole layer; etching the carbon-containing material to form a recess exposing a first portion of the dipole layer over the second gate dielectric layer, wherein a second portion of the dipole layer over the first gate dielectric layer remains covered by the carbon-containing material; removing the first portion of the dipole layer to expose the second gate dielectric layer; removing the carbon-containing material; performing an annealing process to diffuse a dipole dopant from the dipole layer into the first gate dielectric layer; forming a gate electrode over the first and second gate dielectric layers. In some embodiments, the method further includes: during etching the carbon-containing material, introducing a hydrocarbon radical on the carbon-containing material. In some embodiments, the carbon-containing material comprises a bottom antireflective coating, silicon oxy-carbo-nitride, or a combination thereof. In some embodiments, when etching the carbon-containing material, a bias power is periodically switched on and off, and a DC power is periodically switched on and off, wherein the periodical switching of the bias power is synchronized with the periodical switching of the DC power. In some embodiments, the DC power has a power level in a range from about 600 W to about 1000 W. In some embodiments, the bias power has a power level in a range from about 20 W to about 60 W. In some embodiments, etching the carbon-containing material is performed under a pressure in a range from about 5 mT to about 30 mT.

In some embodiments, a semiconductor structure includes a first semiconductor sheet, a second semiconductor sheet, a first high-k dielectric layer, a second high-k dielectric layer, a first metal gate, first epitaxial structures, and second epitaxial structures. The second semiconductor sheet is over the first semiconductor sheet. The first high-k dielectric layer is around the first semiconductor sheet, in which the first high-k dielectric layer has a dipole dopant. The second high-k dielectric layer is around the second semiconductor sheet, in which the second high-k dielectric layer is free of the dipole dopant. The first metal gate is around the first and second high-k dielectric layers. The first epitaxial structures are on opposite side of the first semiconductor sheet, in which the first semiconductor sheet, the first high-k dielectric layer, the first epitaxial structures, and a first portion of the first metal gate form a first bottom-tier transistor. The second epitaxial structures are on opposite side of the second semiconductor sheet, in which the second semiconductor sheet, the second high-k dielectric layer, the second epitaxial structures, and a second portion of the first metal gate form a first top-tier transistor. In some embodiments, the semiconductor structure further includes a third semiconductor sheet, a third high-k dielectric layer, and a second metal gate. The third semiconductor sheet is laterally adjacent to the first semiconductor sheet. The third high-k dielectric layer is around the third semiconductor sheet, in which the third high-k dielectric layer is free of the dipole dopant. The second metal gate is around the third high-k dielectric layer. In some embodiments, the semiconductor structure further includes a fourth semiconductor sheet and a fourth high-k dielectric layer. The fourth semiconductor sheet is over the third semiconductor sheet and laterally adjacent to the second semiconductor sheet. The fourth high-k dielectric layer is around the fourth semiconductor sheet, in which the fourth high-k dielectric layer has the dipole dopant, and the second metal gate further wraps around the fourth high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first semiconductive nanostructure over a substrate and a second semiconductive nanostructure over the first semiconductive nanostructure;
forming first source/drain regions on opposite sides of the first semiconductive nanostructure, and second source/drain regions on opposite sides of the second semiconductive nanostructure;
forming a first high-k dielectric layer around the first semiconductive nanostructure, and a second high-k dielectric layer around the second semiconductive nanostructure;
forming a barrier layer over the first and second high-k dielectric layers;
depositing a dummy material over the barrier layer;
performing an etching process on the dummy material to form a recess exposing a first portion of the barrier layer over the second high-k dielectric layer, wherein a second portion of the barrier layer over the first high-k dielectric layer remains covered by the etched dummy material;
removing the first portion of the barrier layer to expose the second high-k dielectric layer;
removing the dummy material;
after removing the dummy material, doping a dipole dopant into the second high-k dielectric layer; and
forming a gate electrode over the first and second high-k dielectric layers.

2. The method of claim 1, wherein the step of etching process comprises introducing a carbon-containing radical on the dummy material.

3. The method of claim 1, wherein the dummy material has a carbon atomic concentration greater than about 3%.

4. The method of claim 1, wherein the step of performing the etching process comprises:
selectively forming a first passivation layer over a sidewall of the recess in the dummy material during forming the recess.

5. The method of claim 4, wherein the step of performing the etching process comprises:
when the first portion of the barrier layer over the second high-k dielectric layer is exposed, selectively forming a second passivation layer over a bottom of the recess in the dummy material.

6. The method of claim 5, wherein the etching process is performed with a bias power, and the bias power after forming the second passivation layer has a lower power level than prior to forming the second passivation layer.

7. The method of claim 1, wherein in the etching process, a bias power is periodically switched on and off, and a DC power is periodically switched on and off, wherein the periodical switching of the bias power is synchronized with the periodical switching of the DC power.

8. The method of claim 7, wherein the DC power is performed with a pulsing frequency of about 80-120 Hz and a duty cycle set at about 40-60%.

9. The method of claim 7, wherein the bias power is performed with a pulsing frequency of about 80-120 Hz and a duty cycle set at about 40-60%.

10. The method of claim 7, wherein doping the dipole dopant into the second high-k dielectric layer comprises:
forming a dipole layer over and contacting the second high-k dielectric layer; and
performing an annealing process to drive the dipole dopant from the dipole layer into the second high-k dielectric layer.

11. A method, comprising:
forming first and second channel layers vertically arranged with respect to each other over a substrate;
forming a first gate dielectric layer around the first channel layer, and a second gate dielectric layer around the second channel layer;
forming a dipole layer over the first and second gate dielectric layers;
forming a carbon-containing material over the dipole layer;
etching the carbon-containing material to form a recess exposing a first portion of the dipole layer over the second gate dielectric layer, wherein a second portion of the dipole layer over the first gate dielectric layer remains covered by the carbon-containing material;
removing the first portion of the dipole layer to expose the second gate dielectric layer;
removing the carbon-containing material;
performing an annealing process to diffuse a dipole dopant from the dipole layer into the first gate dielectric layer; and
forming a gate electrode over the first and second gate dielectric layers.

12. The method of claim 11, further comprising:
during etching the carbon-containing material, introducing a hydrocarbon radical on the carbon-containing material.

13. The method of claim 11, wherein the carbon-containing material comprises a bottom antireflective coating, silicon oxy-carbo-nitride, or a combination thereof.

14. The method of claim 11, wherein when etching the carbon-containing material, a bias power is periodically switched on and off, and a DC power is periodically switched on and off, wherein the periodical switching of the bias power is synchronized with the periodical switching of the DC power.

15. The method of claim 14, wherein the DC power has a power level in a range from about 600 W to about 1000 W.

16. The method of claim 14, wherein the bias power has a power level in a range from about 20 W to about 60 W.

17. The method of claim 11, wherein etching the carbon-containing material is performed under a pressure in a range from about 5 mT to about 30 mT.

18. A method, comprising:
forming a second semiconductor sheet over a first semiconductor sheet;
forming a first high-k dielectric layer around the first semiconductor sheet, wherein the first high-k dielectric layer has a dipole dopant;
forming a second high-k dielectric layer around the second semiconductor sheet, wherein the second high-k dielectric layer is free of the dipole dopant;
forming a first metal gate around the first and second high-k dielectric layers;
forming first epitaxial structures on opposite side of the first semiconductor sheet, wherein the first semiconductor sheet, the first high-k dielectric layer, the first epitaxial structures, and a first portion of the first metal gate form a first bottom-tier transistor; and forming second epitaxial structures on opposite side of the second semiconductor sheet, wherein the second semiconductor sheet, the second high-k dielectric layer, the second epitaxial structures, and a second portion of the first metal gate form a first top-tier transistor.

19. The method of claim 18, further comprising:

forming a third semiconductor sheet laterally adjacent to the first semiconductor sheet;

forming a third high-k dielectric layer around the third semiconductor sheet, wherein the third high-k dielectric layer is free of the dipole dopant; and forming a second metal gate around the third high-k dielectric layer.

20. The method of claim 19, further comprising:

forming a fourth semiconductor sheet over the third semiconductor sheet and laterally adjacent to the second semiconductor sheet; and forming a fourth high-k dielectric layer around the fourth semiconductor sheet, wherein the fourth high-k dielectric layer has the dipole dopant, and the second metal gate further wraps around the fourth high-k dielectric layer.

* * * * *